United States Patent
Murakami et al.

(10) Patent No.: US 8,963,161 B2
(45) Date of Patent: Feb. 24, 2015

(54) SEMICONDUCTOR DEVICE AND METHOD OF MANUFACTURING THE SAME

(71) Applicant: Semiconductor Energy Laboratory Co., Ltd., Atsugi-shi, Kanagawa-ken (JP)

(72) Inventors: Satoshi Murakami, Kanagawa (JP); Yosuke Tsukamoto, Kanagawa (JP); Tomoaki Atsumi, Kanagawa (JP); Masayuki Sakakura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/026,369

(22) Filed: Sep. 13, 2013

(65) Prior Publication Data

US 2014/0014964 A1    Jan. 16, 2014

Related U.S. Application Data

(63) Continuation of application No. 13/426,650, filed on Mar. 22, 2012, now Pat. No. 8,536,581, which is a continuation of application No. 12/822,260, filed on Jun. 24, 2010, now Pat. No. 8,143,627, which is a (Continued)

(30) Foreign Application Priority Data

Dec. 6, 2000   (JP) .................................. 2000-370873

(51) Int. Cl.
*H01L 27/00*   (2006.01)
*H01L 29/04*   (2006.01)
(Continued)

(52) U.S. Cl.
CPC ................ *H01L 29/04* (2013.01); *H01L 27/12* (2013.01); *H01L 27/1214* (2013.01); *G02F 1/13454* (2013.01); *G02F 1/136204* (2013.01)
USPC .......................................................... 257/72

(58) Field of Classification Search
CPC ............ H01L 27/3272; H01L 27/1108; H01L 27/14692
USPC .................................................. 257/59–60, 72
See application file for complete search history.

(56) References Cited

U.S. PATENT DOCUMENTS 4,792,210 A   12/1988   Maurice
4,794,437 A   12/1988   Palumbo
(Continued)

FOREIGN PATENT DOCUMENTS

EP   0 772 073 A1   5/1997
EP   1 063 630 A2   12/2000
(Continued)

OTHER PUBLICATIONS

European Search Report issued in European Application No. 01129016.0, dated Feb. 25, 2011, 3 pages.

*Primary Examiner* — Nathan Ha
(74) *Attorney, Agent, or Firm* — Fish & Richardson P.C.

(57) ABSTRACT

In a semiconductor device, gate signal lines are spaced apart from each other above a crystalline semiconductor film. Therefore a first protective circuit is not electrically connected when contact holes are opened in an interlayer insulating film. The static electricity generated during dry etching for opening the contact holes moves from the gate signal line, damages a gate insulating film, passes the crystalline semiconductor film, and again damages the gate insulating film before it reaches the gate signal line. As the static electricity generated during the dry etching damages the first protective circuit, the energy of the static electricity is reduced until it loses the capacity of damaging a driving circuit TFT. The driving circuit TFT is thus prevented from suffering electrostatic discharge damage.

28 Claims, 23 Drawing Sheets

Related U.S. Application Data continuation of application No. 11/957,641, filed on Dec. 17, 2007, now Pat. No. 7,791,079, which is a continuation of application No. 11/276,105, filed on Feb. 14, 2006, now Pat. No. 7,314,774, which is a continuation of application No. 10/006,043, filed on Dec. 4, 2001, now Pat. No. 7,067,845.

(51) Int. Cl.
*H01L 27/12* (2006.01)
*G02F 1/1345* (2006.01)
*G02F 1/1362* (2006.01)

(56) References Cited

U.S. PATENT DOCUMENTS

| | | |
|---|---|---|
| 5,234,541 A | 8/1993 | Shannon et al. |
| 5,539,219 A | 7/1996 | den Boer et al. |
| 5,677,745 A | 10/1997 | Kawano et al. |
| 5,744,837 A | 4/1998 | Kamiura et al. |
| 5,781,253 A | 7/1998 | Koike et al. |
| 5,818,070 A | 10/1998 | Yamazaki et al. |
| 5,824,235 A | 10/1998 | Yamazaki et al. |
| 5,938,942 A | 8/1999 | Yamazaki et al. |
| 6,084,579 A | 7/2000 | Hirano |
| 6,084,648 A | 7/2000 | Yeo |
| 6,246,179 B1 * | 6/2001 | Yamada .............. 315/169.3 |
| 6,281,552 B1 | 8/2001 | Kawasaki et al. |
| 6,306,694 B1 | 10/2001 | Yamazaki et al. |
| 6,411,351 B1 | 6/2002 | Zhang et al. |
| 6,472,684 B1 | 10/2002 | Yamazaki et al. |
| 6,614,052 B1 | 9/2003 | Zhang |
| 6,617,648 B1 | 9/2003 | Yamazaki et al. |
| 6,621,102 B2 | 9/2003 | Hirakata et al. |
| 6,642,544 B1 | 11/2003 | Hamada et al. |
| 6,646,287 B1 | 11/2003 | Ono et al. |
| 6,646,693 B2 | 11/2003 | Zhang et al. |
| 6,677,613 B1 * | 1/2004 | Yamazaki et al. .............. 257/72 |
| 6,737,304 B2 | 5/2004 | Yamazaki et al. |
| 6,953,951 B2 | 10/2005 | Yamazaki et al. |
| 7,057,677 B2 | 6/2006 | Zhang et al. |
| 7,425,999 B2 | 9/2008 | Zhang et al. |
| 8,228,585 B2 | 7/2012 | Sato |
| 8,304,300 B2 | 11/2012 | Sakata et al. |
| 2001/0055841 A1 | 12/2001 | Yamazaki et al. |
| 2002/0017645 A1 | 2/2002 | Yamazaki et al. |
| 2002/0028543 A1 | 3/2002 | Yamazaki et al. |
| 2002/0068388 A1 | 6/2002 | Murakami et al. |
| 2002/0153844 A1 | 10/2002 | Koyama |
| 2004/0197971 A1 | 10/2004 | Yamazaki et al. |

FOREIGN PATENT DOCUMENTS

| | | |
|---|---|---|
| JP | 63-045834 A | 2/1988 |
| JP | 09-146107 A | 6/1997 |
| JP | 09-219527 A | 8/1997 |
| JP | 2000-332256 A | 11/2000 |
| JP | 2001-005426 A | 1/2001 |
| JP | 2002-057162 A | 2/2002 |
| JP | 3281848 A | 5/2002 |

* cited by examiner

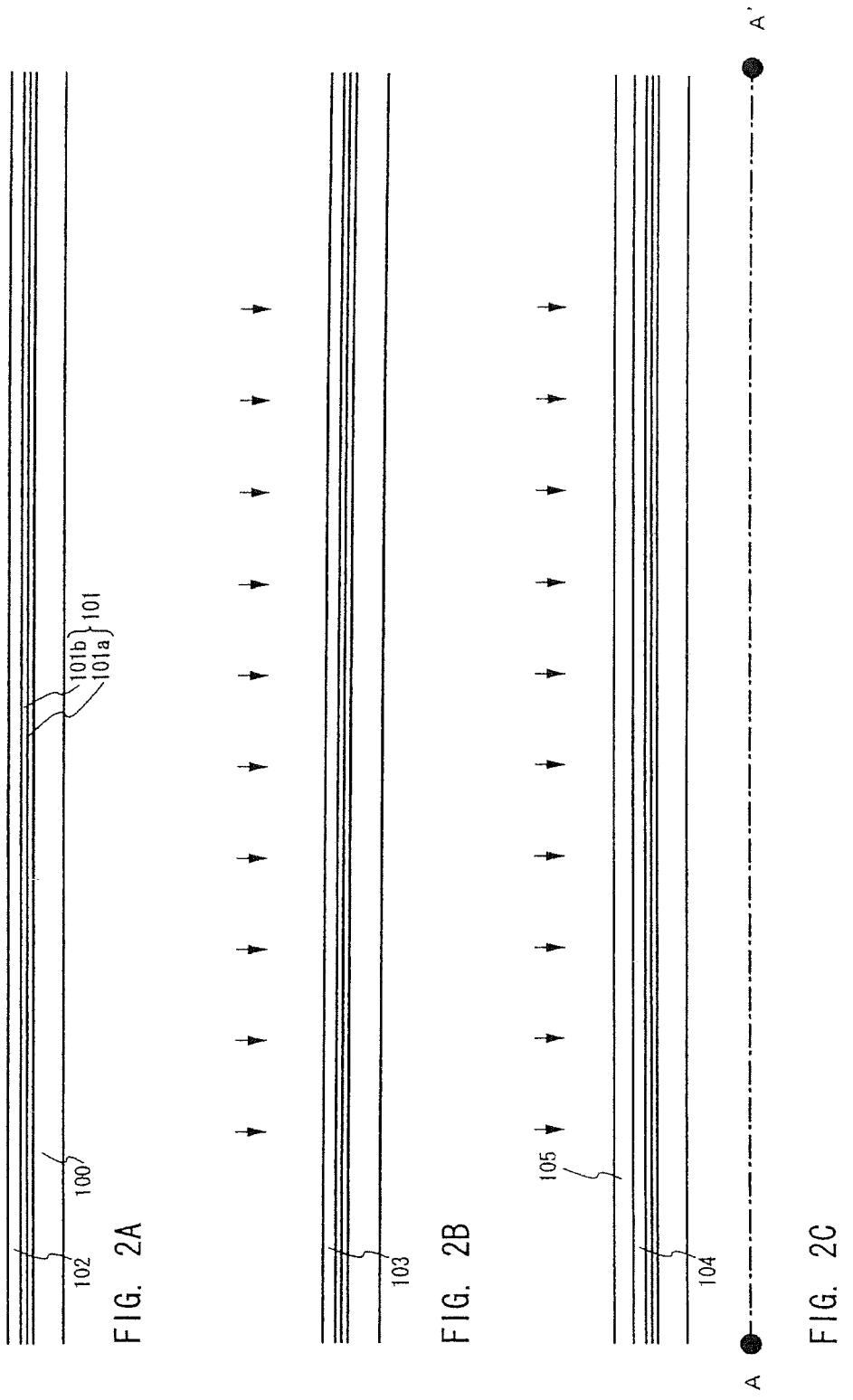

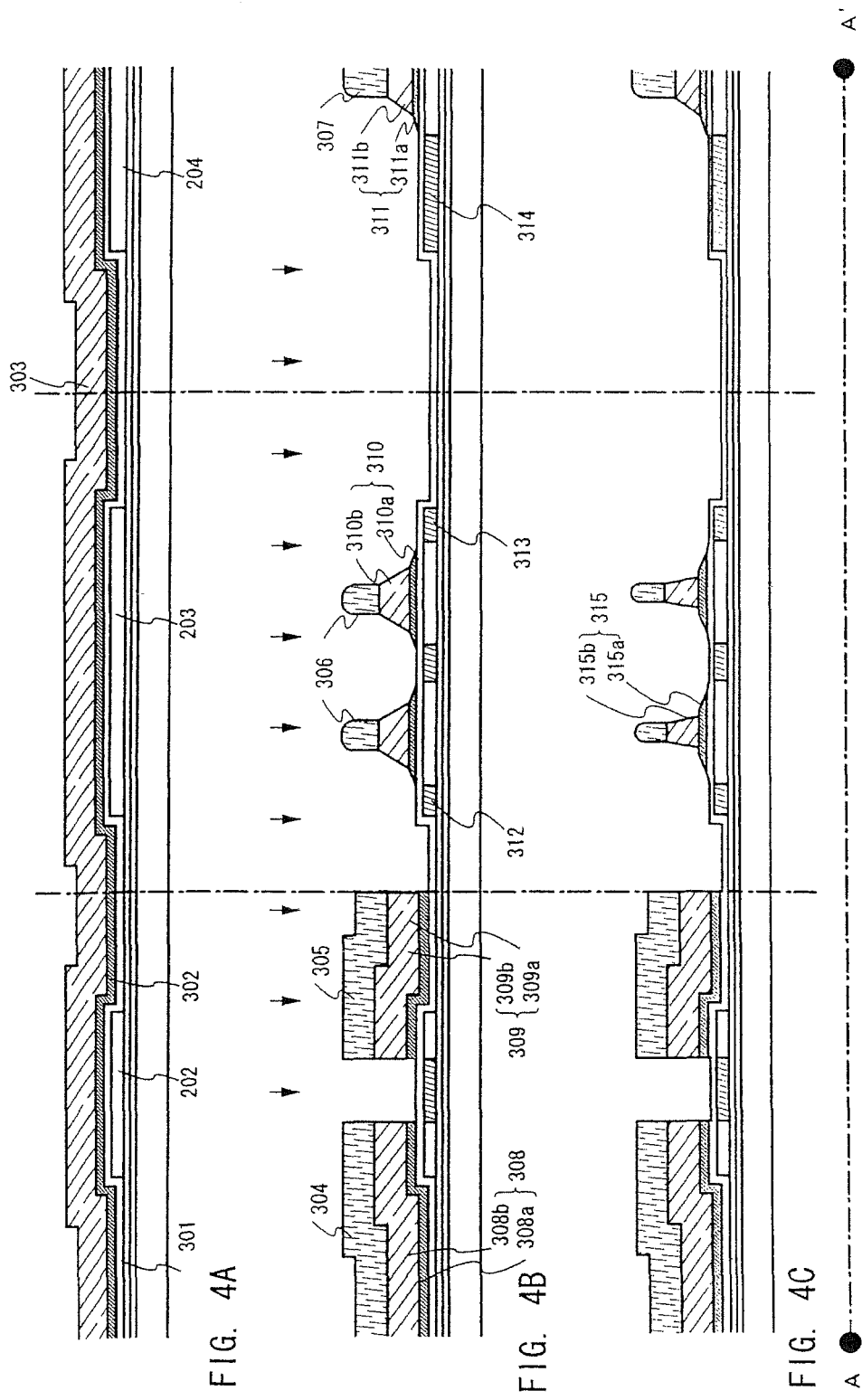

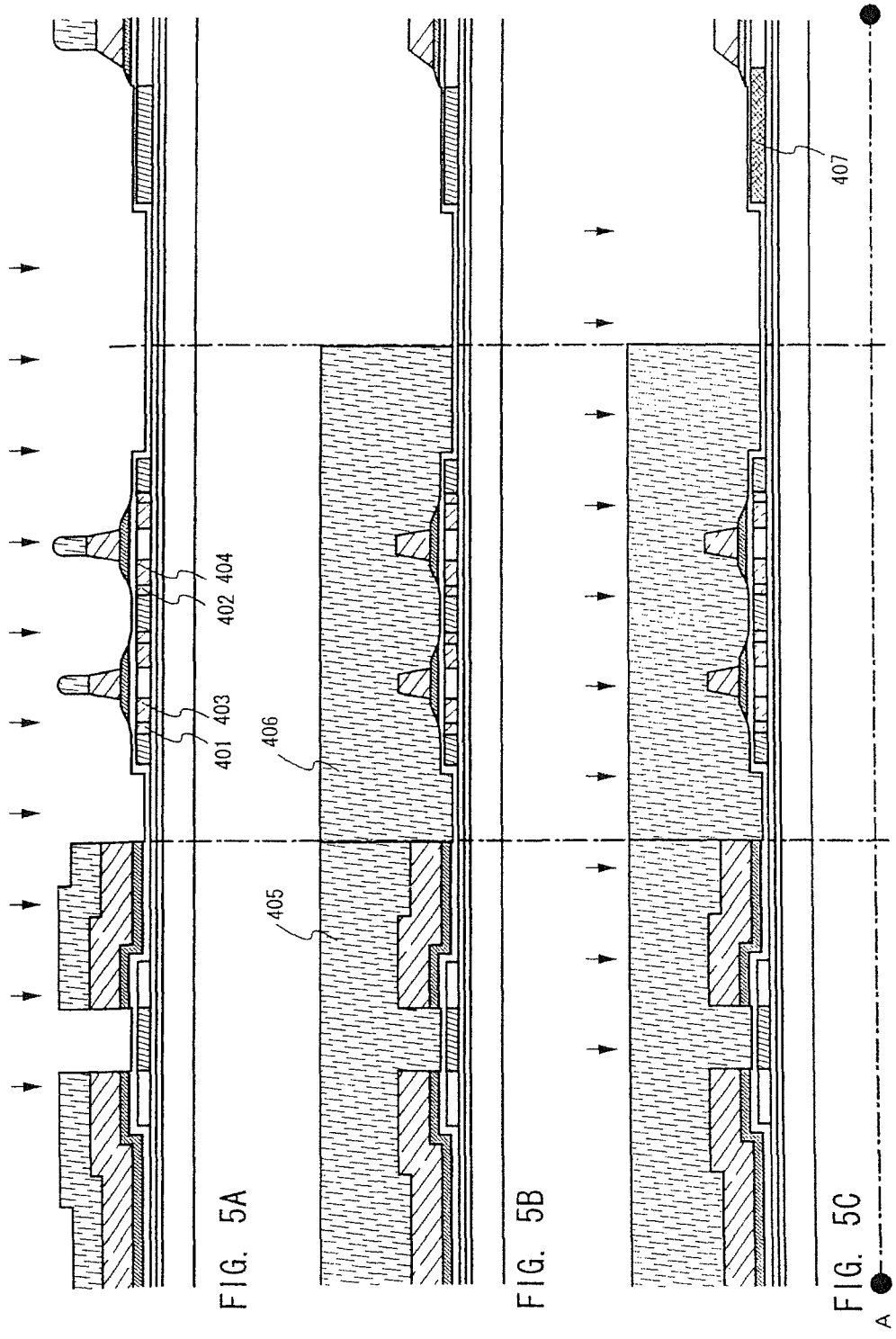

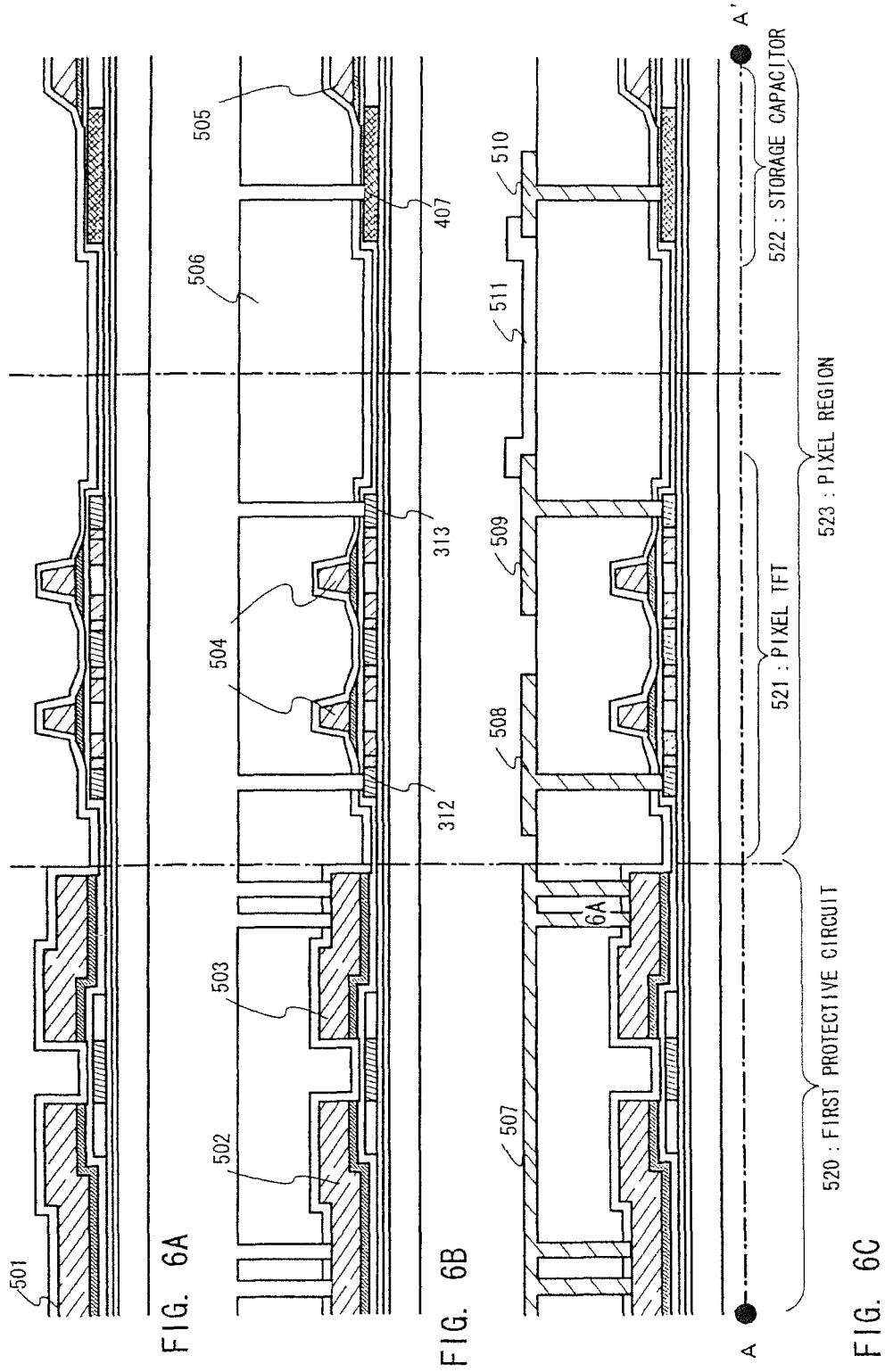

701 : DRIVING CIRCUIT REGION    1102 : FIRST PROTECTIVE CIRCUIT    703 : PIXEL REGION

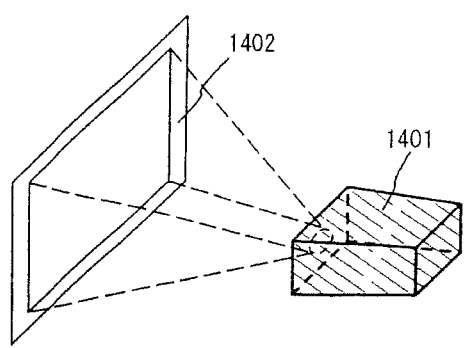
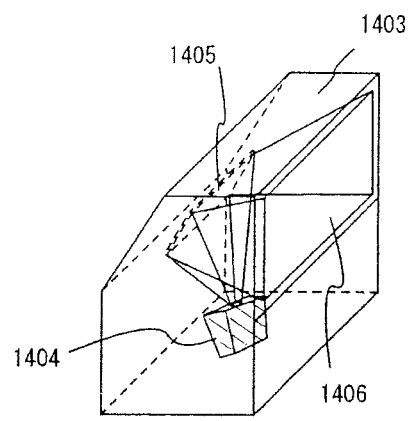
FIG. 15A
FIG. 15B 1279-th  1280-th  1281-th

SEMICONDUCTOR DEVICE AND METHOD OF MANUFACTURING THE SAME

CROSS-REFERENCE TO RELATED APPLICATIONS

This application is a continuation of U.S. application Ser. No. 13/426,650, filed Mar. 22, 2012, now allowed, which is a continuation of U.S. application Ser. No. 12/822,260, filed Jun. 24, 2010, now U.S. Pat. No. 8,143,627, which is a continuation of U.S. application Ser. No. 11/957,641, filed Dec. 17, 2007, now U.S. Pat. No. 7,791,079, which is a continuation of U.S. application Ser. No. 11/276,105, filed Feb. 14, 2006, now U.S. Pat. No. 7,314,774, which is a continuation of U.S. application Ser. No. 10/006,043, filed Dec. 4, 2001, now U.S. Pat. No. 7,067,845, which claims the benefit of a foreign priority application filed in Japan as Serial No. 2000-370873 on Dec. 6, 2000, all of which are incorporated by reference.

BACKGROUND OF THE INVENTION

1. Field of the Invention

The present invention relates to a technique for improving the productivity of a semiconductor device, in particular, to a technique for preventing electrostatic discharge damage to a switching element such as a thin film transistor (TFT).

The term semiconductor device herein generally refers to a device that utilizes semiconductor characteristics for functioning the device. Accordingly, electro-optical devices (hereinafter referred to as display devices), semiconductor circuits, and electronic equipment are all semiconductor devices.

2. Description of the Related Art

A technique for manufacturing a TFT comprising a semiconductor thin film (with a thickness of several hundreds to several thousands nm) formed on a substrate having an insulating surface has recently been developed. TFTs are applied to various semiconductor devices such as integrated circuits (ICs) and electro-optical devices, and quick development of TFTs as switching elements of the display devices or the like is demanded.

Recent semiconductor devices are finding their uses expanding as monitors, televisions, and the display devices for portable terminals. Accordingly, mass production of the semiconductor devices has become common.

FIG. 18 is a diagram showing an example of the entire circuit structure of a conventional semiconductor device. A large number of pixel cells are arranged in rows and columns, forming a pixel cell array in a pixel region 1701. Each of the pixel cells comprises a TFT, a transparent pixel electrode, a liquid crystal, and a capacitor storage.

A gate signal line side driving circuit 1711 comprises a shift register circuit 1707, a level shifter circuit 1708, a buffer circuit 1709, and a protective circuit 1710.

A source signal line side driving circuit 1712 comprises a shift register circuit 1702, a level shifter circuit 1703, a buffer circuit 1704, a sampling circuit 1705, and a pre-charge circuit 1706. Also, the pre-charge circuit 1706 may be positioned so as to face the shift register circuit 1702, the level shifter circuit 1703, the buffer circuit 1704, and the sampling circuit 1705 with the pixel region 1701 interposed therebetween.

In this semiconductor device, a crystalline semiconductor film is formed on an insulating surface, a gate insulating film is formed on the crystalline semiconductor film, and a gate electrode is formed on the gate insulating film in order to fabricate the thin film transistors. The thin film transistors are then covered with an interlayer insulating film, and contact holes are formed in the interlayer insulating, film through dry etching and a metal wiring line is formed to electrically connect the thin film transistors with one another.

The above semiconductor device manufacturing process is characterized in that the pixel region 1701, the gate signal line side driving circuit 1711, and the source signal line side driving circuit 1712 are simultaneously formed through the same steps.

A description will be given with reference to FIGS. 19A to 19C on a method of manufacturing the conventional circuit, electrostatic generation, and damage to TFTs by static electricity. Crystalline semiconductor films 1803 and 1804 are formed first on an insulating surface. Next, an insulating film 1805 is formed so as to cover the crystalline semiconductor films 1803 and 1804. A gate signal line 1806 is then formed on the insulating film 1805. Through these three steps, a pixel TFT 1801 and a driving circuit TFT 1802 are formed simultaneously. (FIG. 19A)

An interlayer insulating film 1807 is formed so as to cover the pixel TFT 1801 and the driving circuit TFT 1802. In order to connect the pixel TFT 1801 to the driving circuit TFT 1802 electrically, contact holes 1808 and 1809 are formed by dry etching. It has been confirmed that static electricity is generated during the dry etching step, and that the generated static electricity moves from one contact hole to the gate signal line. An arrow shown in FIG. 19B indicates the movement of the static electricity generated in the contact hole of the pixel TFT toward the driving circuit TFT through the gate signal line. Reaching the driving circuit TFT, the static electricity damages the gate insulating film of the driving circuit TFT and then moves to the crystalline semiconductor film 1803. The driving circuit TFT 1802 is thus damaged by static electricity. (FIG. 19B) The conventional circuits are not capable of preventing damage to TFTs by static electricity that is generated and moves as described above.

FIG. 20 shows electrostatic discharge damage to a TFT near a pre-charge circuit in a conventional circuit. Static electricity generated in a pixel region moves along a source signal line to a contact hole 1903 on the upper end of the pixel region. The static electricity then moves to a contact hole 1904 in a drain portion of the pre-charge circuit. From the contact hole 1904 in the drain portion of the pre-charge circuit, the static electricity moves to a first signal line 1905 of the pre-charge circuit and then to a second signal line 1906 of the pre-charge circuit.

When the static electricity moves from the contact hole 1904 in the drain portion of the pre-charge circuit to the first signal line 1905 of the pre-charge circuit, an insulating film is damaged to break the pre-charge circuit. The conventional circuits are not capable of preventing damage to pre-charge circuits by static electricity that is generated and moves as described above.

Electrostatic discharge damage as described above may lead to display defects such as line defect and dot defect in panel display by a semiconductor device, thereby lowering its yield and reliability.

Upon manufacturing a semiconductor device, minute processing is required and dry etching that can provide excellent minute processing is indispensable especially upon forming a contact hole with a diameter of 3 μm in an interlayer insulating film.

A dry etching process includes the following steps (1) through (6) and the steps (2) through (6) are repeated.

(1) An etching gas (e.g., $XeF_2$ or $CF_4$) is introduced into a vacuum chamber and a high frequency voltage is applied between an upper electrode and a lower electrode to generate plasma.

(2) Reactive ions having positive electric charge from the generated plasma enter a surface of the interlayer insulating film at a right angle.

(3) The reactive ions adsorb to the surface of the interlayer insulating film.

(4) The reactive ions that has adsorbed to the surface of the interlayer insulating film react thereon to produce a reaction product.

(5) The reaction product leaves from the surface of the interlayer insulating film.

(6) The reaction product that has left from the surface of the interlayer insulating film is discharged.

Electrostatic generation is a result of separating positive electric charge and negative electric charge from each other by a mechanical effect and therefore takes place between the surfaces of solids or between the surfaces of a solid and a liquid. Static electricity is generated also when a gas separates a solid surface and a liquid surface or when a solid or a liquid contains an ionized gas. Then static electricity could be generated in the above steps (3) and (5) and electrostatic generation cannot be avoided.

When a contact hole is opened in an interlayer insulating film through dry etching in particular, electrostatic discharge damage that takes place between the contact hole and a gate signal line is so great that silicon eliminates. The static electricity in this case is often observed to move from a contact hole to another contact hole.

A long gate signal line has an antenna effect that attracts static electricity, and electrostatic discharge damage takes place at both ends of the gate signal line.

Against electrostatic discharge damage, the conventional circuit is provided with a protective circuit 1710 that is placed in the gate signal line side driving circuit 1711. However, the protective circuit 1710 is the type that functions after a metal wiring line is formed and therefore has no effect of preventing damage to the TFT by static electricity generated when the contact holes are opened in the interlayer insulating film as a step included in the TFT manufacturing process. The static electricity thus moves along the gate signal line to the gate electrode of the TFT and damages the gate insulating film there before moving to the source signal line from a source or drain region of the TFT. In the manner described above, static electricity damages the TFTs in the gate signal line side driving circuit 1711 and in the pixel region 1701.

The static electricity generated in the pixel region during the dry etching for opening the contact holes in the interlayer insulating film further moves from the contact hole at the upper end of the pixel region 1701 to the contact hole in the drain portion of the pre-charge circuit 1706. Then the static electricity moves to the first signal line of the pre-charge circuit 1706 and to the second signal line of the pre-charge circuit. As the static electricity moves from the contact hole in the drain portion of the pre-charge circuit 1706 to the first signal line of the pre-charge circuit 1706, it damages the insulating film.

As described above, the conventional semiconductor device circuit is not capable of preventing damage to the TFTs in the gate signal line side driving circuit 1711, the pixel region 1701, and the source signal line driving circuit 1712 by the static electricity that is generated during dry etching for opening the contact holes in the interlayer insulating film. This leads to display defects such as line defect and dot defect in panel display of the semiconductor device, thereby lowering yield and reliability.

SUMMARY OF THE INVENTION

The present invention has been made in view of the above, and an object of the present invention is therefore to provide a semiconductor device that can avoid electrostatic discharge damage and a method of manufacturing the semiconductor device.

One of the features of the present invention is that semiconductor device comprising: a crystalline semiconductor film formed on an insulating surface; an insulating film formed on the crystalline semiconductor film; and a first signal line and a second signal line that partially overlap the crystalline semiconductor film while sandwiching the insulating film therebetween, wherein the first signal line and the second signal line are connected to each other through a metal wiring line.

According to the above feature, wherein the first signal line and the second signal line are spaced apart from each other so that the first signal line and the crystalline semiconductor film sandwich the insulating film while the second signal line and the crystalline semiconductor film sandwich the insulating film.

According to the above feature, wherein the first signal line and the second signal line are gate signal lines.

According to the above feature, wherein the first signal line and the second signal line are connected to a gate electrode of a thin film transistor constituting a driving circuit or a pixel.

According to the above feature, wherein the crystalline semiconductor film contains an impurity element giving an n type or a p type conductivity.

Another feature of the present invention is that a semiconductor device comprising a pixel and a driving circuit, wherein one or more first protective circuits are provided between the driving circuit and the pixel or between a second protective circuit and the pixel, the driving circuit and the pixel, or the second protective circuit and the pixel, being connected to each other by a gate signal line, and wherein the first protective circuits protect the pixel and the driving circuit from static electricity.

Also, another one of features of the present invention is that a method of manufacturing a semiconductor device comprising steps of: forming a crystalline semiconductor film on an insulating surface; forming an insulating film on the crystalline semiconductor film; forming a conductive film on the insulating film; patterning the conductive film to form a gate electrode: forming an interlayer insulating film covering the gate electrode forming a contact hole in the interlayer insulating film; and forming a metal wiring line that is electrically connected to a thin film transistor, wherein, the method further comprises the steps of: forming a second crystalline semiconductor film on an insulating surface in the step of forming the crystalline semiconductor film; forming an insulating film on the second crystalline semiconductor film in the step of forming an insulating film; patterning the conductive film to form a first gate signal line and a second gate signal line; forming an interlayer insulating film so as to cover the first gate signal line and the second gate signal line; forming a contact hole in the interlayer insulating film; and forming a metal wiring line that electrically connects the first gate signal line with the second gate signal line.

Also, another one of features of the present invention is that a semiconductor device comprising a pre-charge circuit, wherein a first signal line of the pre-charge circuit is spaced apart from a second signal line of the pre-charge circuit, and wherein a contact portion is provided at an end of the first signal line.

One of the features of the present invention is that a first protective circuit is provided in advance in the path through which static electricity travels in order to let static electricity do damage the first protective circuit, and another one of the features of the present invention is that a path for static electricity to travel is provided in a pre-charge circuit in advance in order to prevent damage to the pre-charge circuit. Electrostatic discharge damage to a pixel TFT and a driving circuit TFT can be prevented by these methods. Accordingly, in the one of features, the present invention places a first protective circuit for preventing electrostatic discharge damage to a pixel TFT and a driving circuit TFT between a pixel region and a driving circuit region, or between a pixel region and a second protective circuit. Also, in the pre-charge circuit, an end of a first signal line of the pre-charge circuit is provided apart from an end of a signal line of the pixel region, and a contact hole is formed at the end of the first signal line of the pre-charge circuit so as to make generated static electricity move to a second signal line of the pre-charge circuit without damaging TFTs in the pre-charge circuit.

According to the present invention, the first protective circuit for preventing electrostatic discharge damage to the pixel TFT and the driving circuit TFT, and the pre-charge circuit can be formed at the same time when the thin film transistors of the pixel region and the driving circuit region are formed, and formed by the same process as the manufacture process of the thin film transistors. Therefore, no additional manufacturing process is needed.

The first protective circuit in this specification refers to a circuit that protects a pixel TFT and a driving circuit TFT from static electricity generated during a semiconductor device manufacturing process. The first protective circuit lets the generated static electricity damage itself in order to reduce an energy of the generated static electricity, thereby preventing electrostatic discharge damage to the pixel TFT and the driving circuit TFT.

Described first with reference to FIGS. 1A to 1C is a method of preventing electrostatic discharge damage to a pixel TFT and a driving circuit TFT by providing a first protective circuit in the path where static electricity travels, which is generated during dry etching for opening contact holes in an interlayer insulating film, to thereby damage the first protective circuit.

First, crystalline semiconductor films 14, 15, and 16 are formed on an insulating surface. An insulating film 17 is formed next so as to cover the crystalline semiconductor films 14, 15, and 16. On the insulating film 17, gate signal lines 18 and 19 are formed. (FIG. 1A)

In the first protective circuit, the gate signal line 18 is spaced apart from the gate signal line 19 above the crystalline semiconductor film 15, and therefore the gate signal lines 18 and 19 have no electrical connection when contact holes are opened in an interlayer insulating film 20. Since static electricity generated during dry etching for forming a contact hole 24 cannot move along the gate signal line 19 directly, as indicated by an arrow shown in FIG. 1B, the static electricity moves from the gate signal line 19; damages the gate insulating film 17; passes the crystalline semiconductor film 15; and again damages the gate insulating film 17 before it reaches the gate signal line 18. A contact hole 21 and the contact hole 24 shown in FIG. 1B are reached the semiconductor films 14 and 16, respectively. (FIG. 1B)

At a time when the static electricity generated during the dry etching for forming the contact holes in the interlayer insulating film 20 damages a first protective circuit 13, the energy of the static electricity is reduced until it loses the capacity of damaging a driving circuit TFT 12. As a result, the driving circuit TFT 12 is thus prevented from suffering electrostatic discharge damage. (FIG. 1B)

At the point illustrated in FIG. 1B, the gate signal lines 18 and 19 are not connected to each other, and therefore a pixel region is not electrically connected to a driving circuit region. To connect the pixel region and the driving circuit region to each other, a metal wiring line 26 is formed by a metal wiring line forming process. (FIG. 1C)

Described next is a method of preventing electrostatic discharge damage to a pre-charge circuit by providing in advance a path for static electricity generated during dry etching for opening contact holes in an interlayer insulating film to travel.

A pre-charge circuit is arranged apart from a pixel region in order to make static electricity generated during dry etching for opening contact holes in an interlayer insulating film move to a first signal line of the pre-charge circuit. A contact hole is formed at an end of the first signal line of the pre-charge circuit by the pixel region side. As a result, the static electricity moves from the contact hole at the upper end of the pixel region through the contact hole provided at the end of the first signal line of the pre-charge circuit to the first signal line of the pre-charge circuit. The static electricity has moved to the first signal line flows a second signal line of the pre-charge circuit. Electrostatic discharge damage to the pre-charge circuit thus can be prevented.

BRIEF DESCRIPTION OF THE DRAWINGS

In the accompanying drawings:

FIGS. 2A to 2C are diagrams showing a process of manufacturing a semiconductor device with a first protective circuit incorporated therein;

FIGS. 4A to 4C are diagrams showing a process of manufacturing a semiconductor device with a first protective circuit incorporated therein;

FIGS. 5A to 5C are diagrams showing a process of manufacturing a semiconductor device with a first protective circuit incorporated therein;

FIGS. 6A to 6C are diagrams showing a process of manufacturing a semiconductor device with a first protective circuit incorporated therein;

FIGS. 15A and 15B are diagrams showing examples of devices utilizing a semiconductor device;

DETAILED DESCRIPTION OF THE PREFERRED EMBODIMENTS

[Embodiment Mode 1]

Figure 8A:
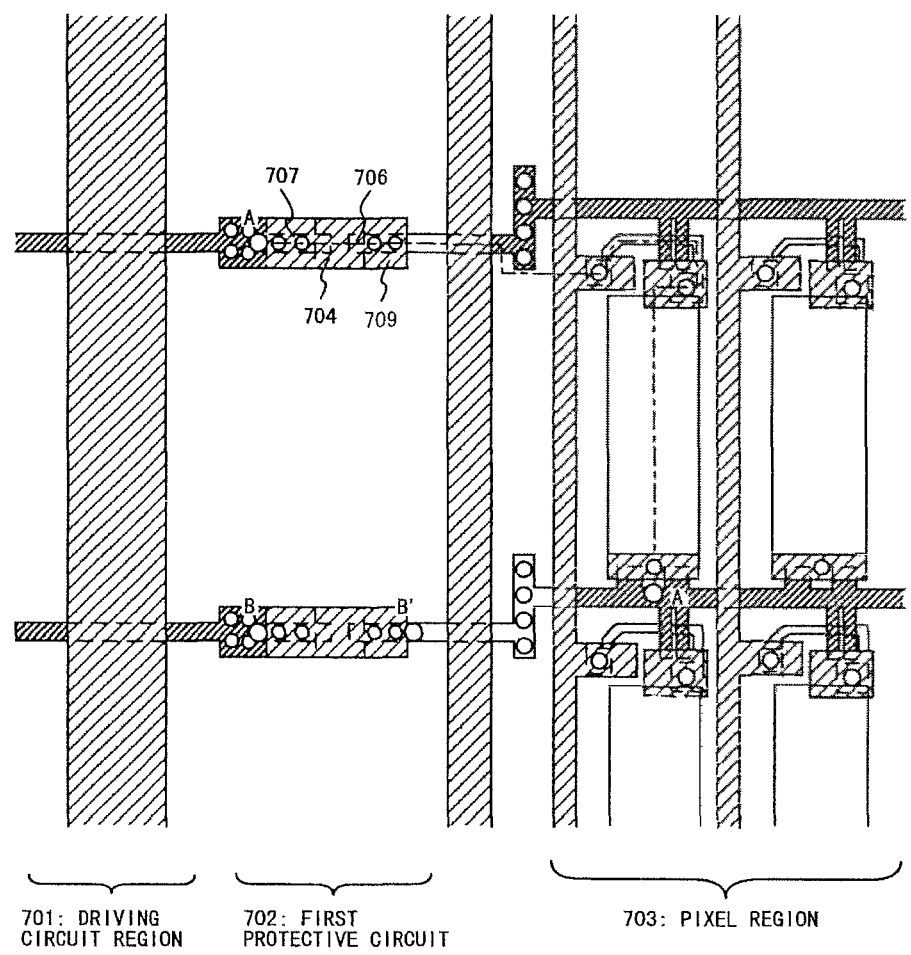
FIGS. 8A and 8B are a diagram showing an embodiment mode in which a first protective circuit is placed between a pixel region and a driving circuit region and a sectional view of the first protective circuit, respectively.
Figure 8B:
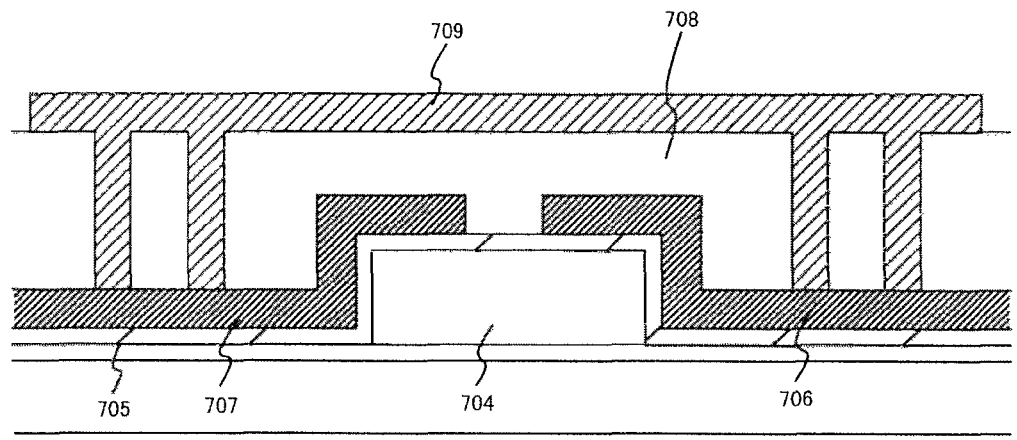

FIG. 8A shows, as an embodiment mode of the present invention, a circuit with a first protective circuit placed between a pixel region and a driving circuit region. FIG. 8B is an enlarged sectional view of the first protective circuit. An embodiment mode of the first protective circuit will be described with reference to FIGS. 8A and 8B.

A crystalline semiconductor film 704 is formed on a base film (not indicated by a symbol in FIGS. 8A and 8B), which is formed on a glass surface. A gate insulating film 705 with a thickness of 10 to 200 nm, preferably, 50 to 150 nm, is formed so as to cover the crystalline semiconductor film 704. On the gate insulating film 705, gate signal lines 706 and 707 are formed to have a thickness of 100 to 400 nm. The gate signal lines 706 and 707 are spaced apart from each other above the crystalline semiconductor film 704.

An interlayer insulating film 708 is laid on the crystalline semiconductor film 704 and the gate signal lines 706 and 707. Contact holes are formed in the interlayer insulating film 708 and a metal wiring line 709 is formed so as to electrically connect the gate signal lines 706 and 707. The metal wiring line 709 electrically connects a pixel region 703 to a driving circuit region 701 when the first protective circuit is damaged by static electricity.

Static electricity generated through dry etching for opening the contact holes in the interlayer insulating film in the pixel region 703 moves from the gate signal line 706 toward the driving circuit region 701. When the contact holes are opened in the interlayer insulating film, the gate signal lines 706 and 707 are spaced apart from each other. Accordingly, the static electricity that has traveled along the gate signal line 706 damages the gate insulating film 705 before moving to the crystalline semiconductor film 704. Then the static electricity again damages the gate insulating film 705, and moves through the gate signal line 707 to the driving circuit region 701.

The static electricity damages a first protective circuit 702 to reduce its energy until the static electricity loses the capacity of damaging the driving circuit region 701. Therefore the static electricity causes no damage upon reaching the driving circuit region 701. Electrostatic discharge damage to the driving circuit region 701 is thus prevented.

On the other hand, static electricity that is generated through dry etching for opening contact holes in the interlayer insulating film in the driving circuit region 701 moves from the gate signal line 707 toward the pixel region 703.

This static electricity damages the first protective circuit 702 to reduce its energy until the static electricity loses the capacity of damaging the pixel region 703. Therefore the static electricity causes no damage upon reaching the pixel region 703. Electrostatic discharge damage to the pixel region 703 is thus prevented.

Thereafter, the metal wiring line 709 is electrically connected to the gate signal lines 706 and 707 to electrically connect the pixel region 703 to the driving circuit region 701.

[Embodiment Mode 2]

Figure 9A:
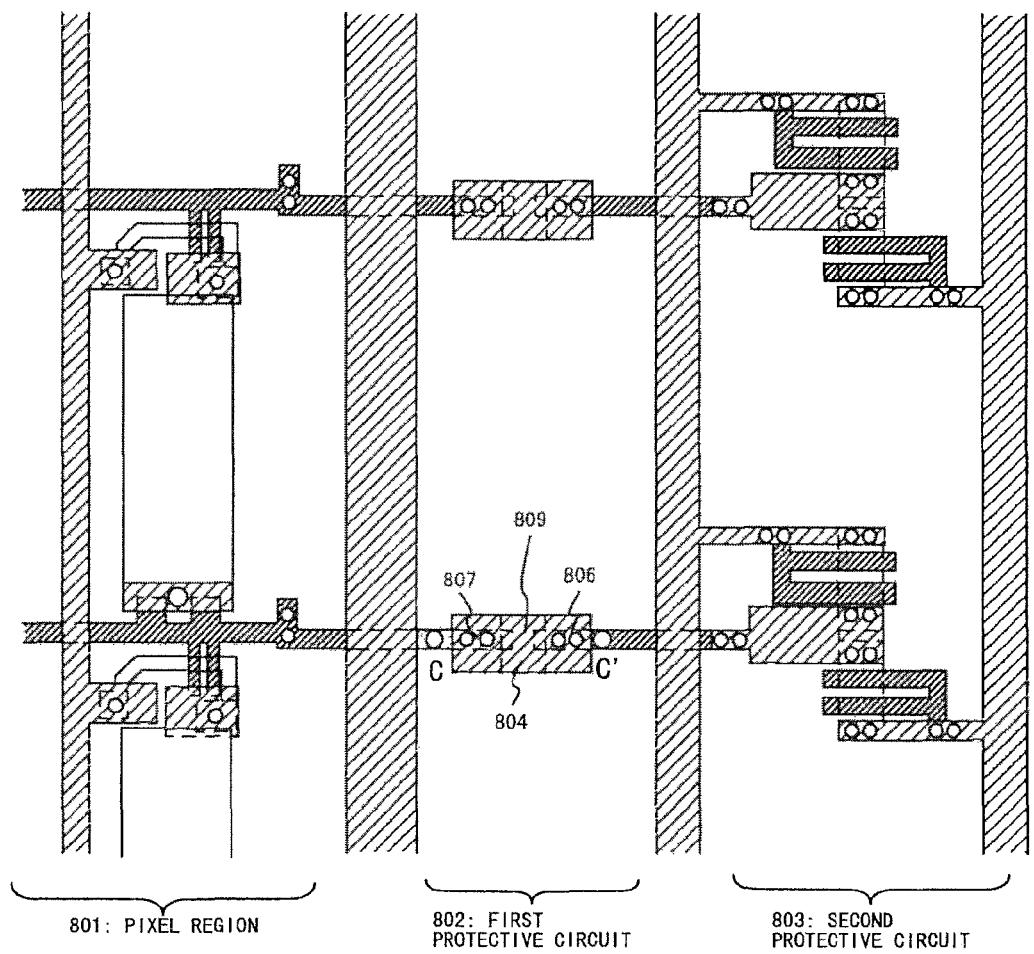
FIGS. 9A and 9B are a diagram showing an embodiment mode in which a first protective circuit is placed between a pixel region and a second protective circuit and a sectional view of the first protective circuit, respectively.
Figure 9B:
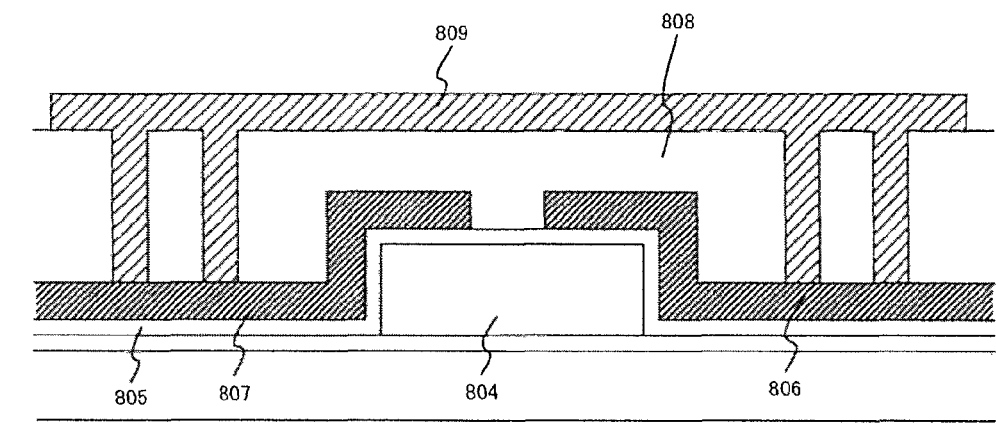

FIG. 9A shows as an embodiment mode of the present invention a circuit with a first protective circuit placed between a pixel region and a second protective circuit. FIG. 9B is an enlarged sectional view of the first protective circuit. An embodiment mode of the first protective circuit will be described with reference to FIGS. 9A and 9B.

A first protective circuit 802 are arranged interposed between the pixel region 801 and the second protective circuit 803. The first protective circuit 802 has the same structure and function as those of the first protective circuit 702, which is interposed between the pixel region and the driving circuit region in Embodiment Mode 1. The second protective circuit 803 comprises a semiconductor film.

Static electricity is generated through dry etching for opening contact holes in an interlayer insulating film in a pixel region 801. The static electricity generated moves from a gate signal line 807 toward a second protective circuit 803. When the contact holes are opened in the interlayer insulating film, the gate signal lines 806 and 807 are spaced apart from each other. Accordingly, the static electricity that has traveled along the gate signal line 807 damages a gate insulating film 805 before moving to a crystalline semiconductor film 804. Then the static electricity again damages the gate insulating film 805, and moves through the gate signal line 806 to the second protective circuit 803.

The static electricity damages the first protective circuit 802 to reduce its energy until the static electricity loses the capacity of damaging the second protective circuit 801. Therefore the static electricity causes no damage upon reaching the second protective circuit 801. Electrostatic discharge damage to the second protective circuit 801 is thus prevented.

Thereafter, a metal wiring line 809 is electrically connected to the gate signal lines 806 and 807 to electrically connect the pixel region 801 to the second protective circuit 803.

[Embodiment Mode 3]

Figure 10:
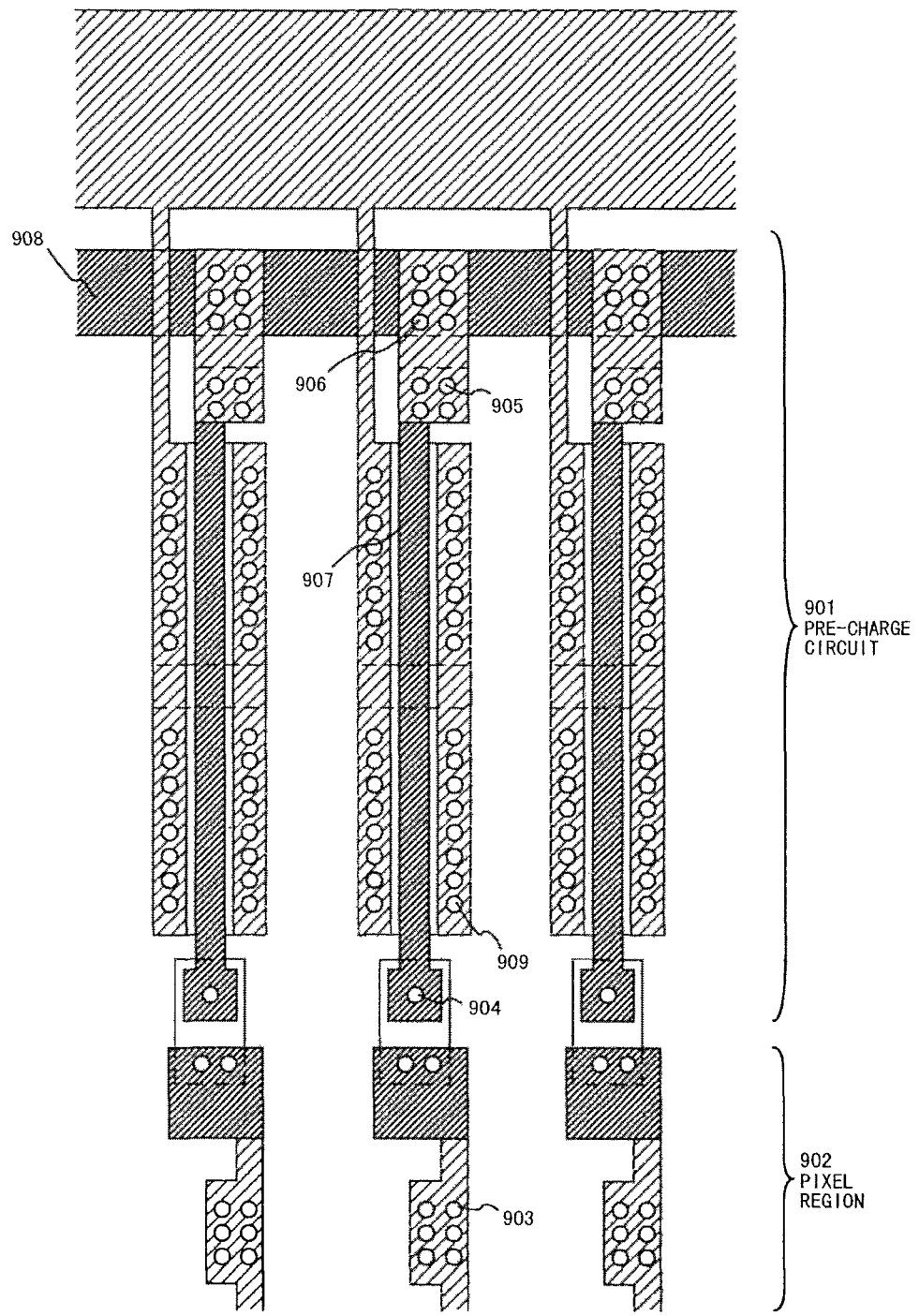
FIG. 10 is a diagram illustrating a method of preventing electrostatic discharge damage to a pre-charge circuit by providing a path in the pre-charge circuit so that static electricity travels along the path.

FIG. 10 shows a pre-charge circuit and circuits in the periphery thereof in accordance with an embodiment mode of the present invention. An embodiment mode of the pre-charge circuit will be described with reference to FIG. 10.

A pre-charge circuit 901 is spaced apart from a pixel region 902. The pre-charge circuit has a first signal line 907, which has a contact hole 904 at an end on the pixel region side. Also provided are a contact hole 905 of the pre-charge circuit, a second signal line 908 of the pre-charge circuit, and a contact hole 906 of the second signal line of the pre-charge circuit. The first signal line 907 of the pre-charge circuit is not directly connected to the second signal line 908 of the pre-charge circuit but electrically connected through a metal wiring line.

Static electricity is generated through dry etching for opening contact holes in an interlayer insulating film in the pixel region 902. The static electricity generated moves from a contact hole 903 of a pixel to the contact hole 904 of the first signal line of the pre-charge circuit. From the contact hole 904 of the first signal line of the pre-charge circuit, the static electricity moves to the contact hole 905 of the pre-charge circuit. The static electricity then leaves the contact hole 905 of the pre-charge circuit for the contact hole 906 of the second signal line of the pre-charge circuit.

While the static electricity moves as described above, owing to the contact hole 904 of the first signal line of the pre-charge circuit, the static electricity runs through the first signal line 907 of the pre-charge circuit without flowing into a contact hole 909 of a drain portion of the pre-charge circuit. Therefore damage to the pre-charge circuit is avoided.

[Embodiment Mode 4]

Figure 11:
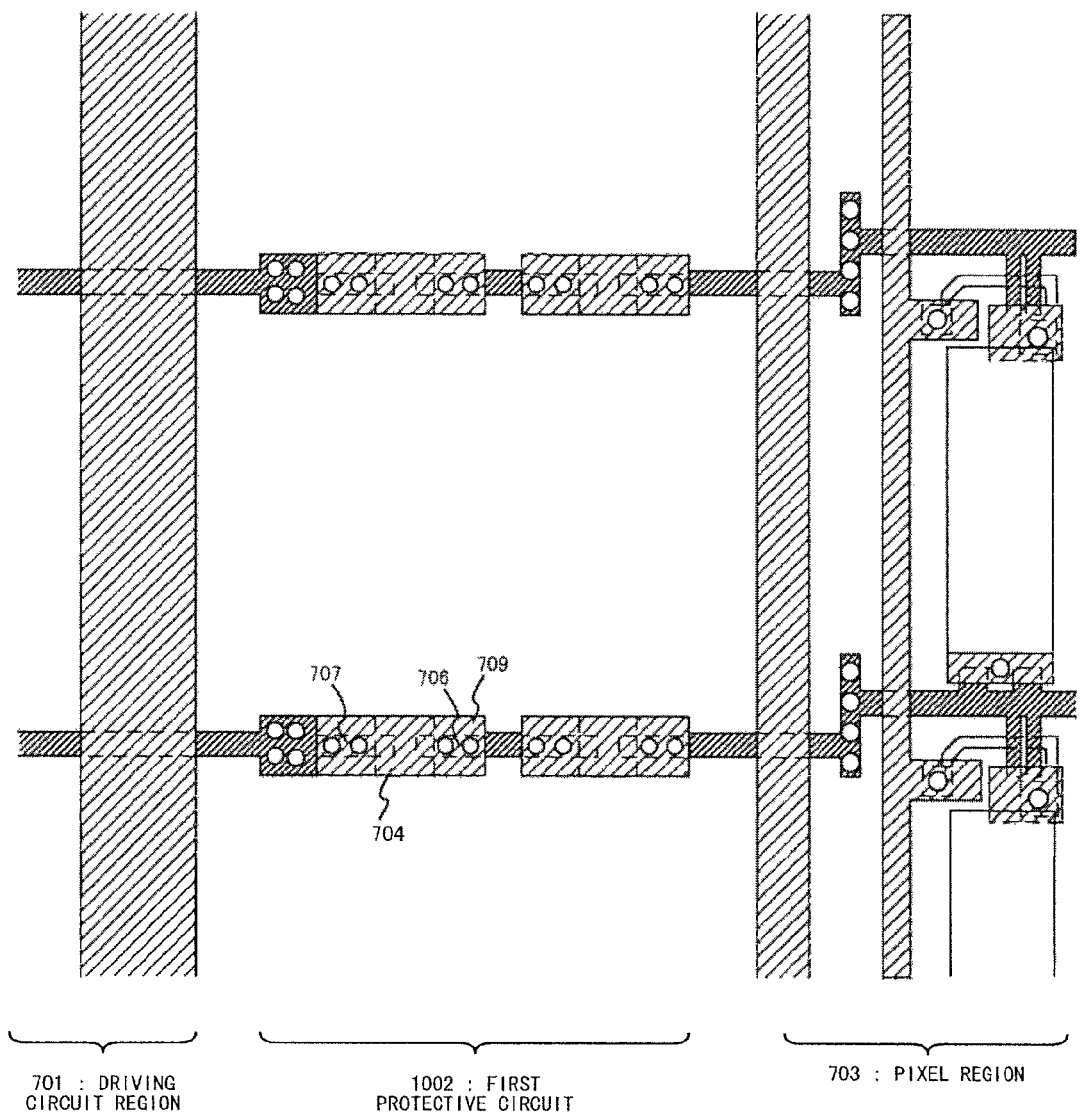
FIG. 11 is a diagram showing an embodiment mode in which first protective circuits are placed between a pixel region and a driving circuit region.

FIG. 11 shows a circuit in which two first protective circuits 1002 are placed between a pixel region and a driving circuit region.

Each of the first protective circuits 1002 has the same structure as the first protective circuit 702, and static electricity generated through dry etching for opening contact holes in an interlayer insulating film is allowed to damage the first protective circuits 1002 to thereby prevent electrostatic discharge damage to a pixel TFT and a driving circuit TFT.

With two first protective circuits arranged as shown in FIG. 11, the static electricity generated through dry etching for opening contact holes in an interlayer insulating film loses more energy. This makes the electrostatic discharge damage countermeasure more effective.

[Embodiment Mode 5]

Figure 12A:
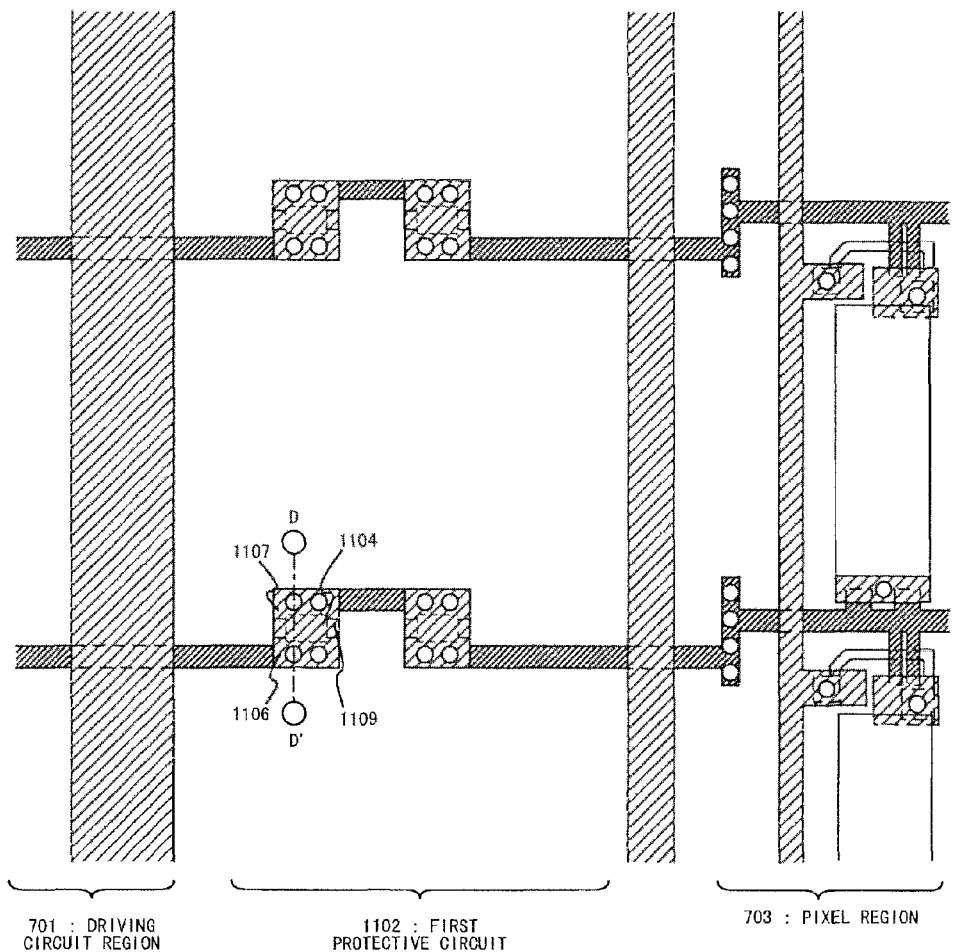
FIGS. 12A and 12B are a diagram showing an embodiment mode in which first protective circuits are placed between a pixel region and a driving circuit region and a sectional view of the first protective circuits, respectively.
Figure 12B:
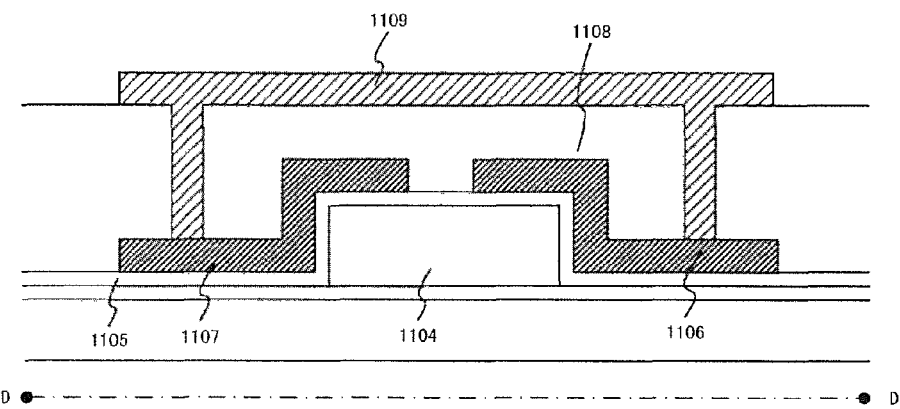

FIG. 12A shows a circuit in which two first protective circuits 1102 are placed between a pixel region and a driving circuit region. FIG. 12B shows a sectional view of the first protective circuits 1102.

Each of the first protective circuits 1102 has the same structure as the first protective circuit 702, and static electricity generated through dry etching for opening contact holes in an interlayer insulating film is allowed to damage the first protective circuits 1102 to thereby prevent electrostatic discharge damage to a pixel TFT and a driving circuit TFT.

With two first protective circuits arranged as shown in FIG. 12, the static electricity generated through dry etching for opening contact holes in an interlayer insulating film loses more energy. This makes the electrostatic discharge damage countermeasure more effective.

[Embodiment Mode 6]

Figure 13A:
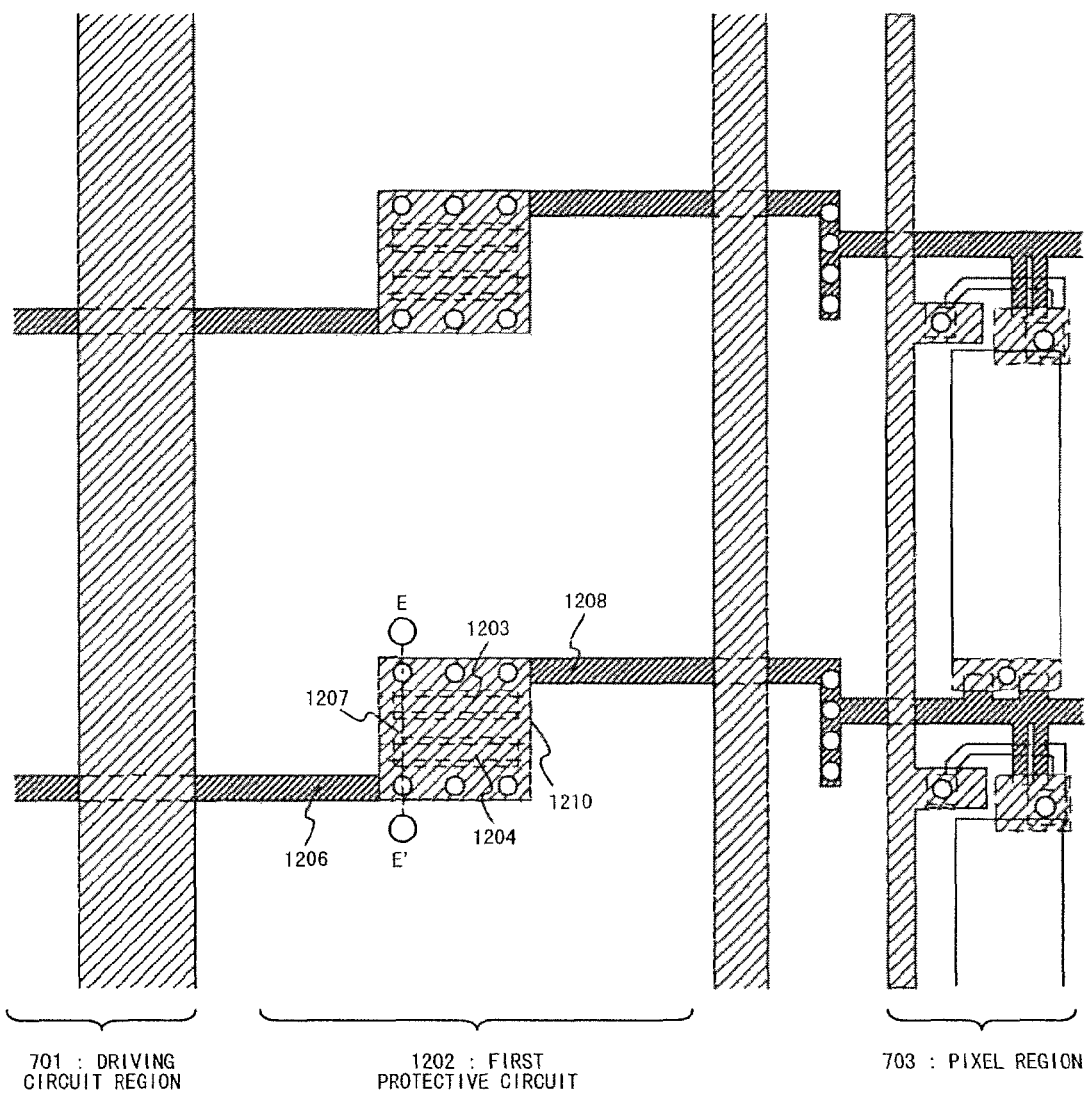
FIGS. 13A and 13B are a diagram showing an embodiment mode in which a first protective circuit is placed between a pixel region and a driving circuit region and a sectional view of the first protective circuit, respectively.
Figure 13B:
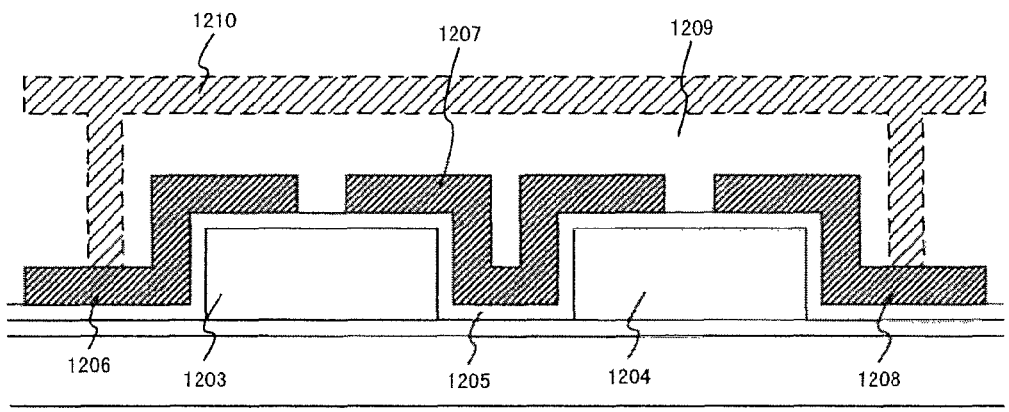

FIG. 13A shows a circuit with a first protective circuit 1202 placed between a pixel region and a driving circuit region. FIG. 13B is a sectional view of the first protective circuit 1202.

Crystalline semiconductor films 1203 and 1204 are formed on a base film (not indicated by a symbol in FIGS. 13A and 13B), which is formed on a glass surface. A gate insulating film 1205 is formed so as to cover the crystalline semiconductor films 1203 and 1204. On the gate insulating film 1205, gate signal lines 1206 to 1208 are formed. The gate signal lines 1206 and 1207 are spaced apart from each other above the crystalline semiconductor film 1203. The gate signal lines 1207 and 1208 are spaced apart from each other above the crystalline semiconductor film 1204.

An interlayer insulating film 1209 is laid on the crystalline semiconductor films 1203 and 1204 and the gate signal lines 1206 to 1208. Contact holes are formed in the interlayer insulating film 1209 and a metal wiring line 1210 is formed to electrically connect the gate signal lines 1206 and 1208 to each other. The metal wiring line 1210 electrically connects a pixel region 703 to a driving circuit region 701 after the first protective circuit is damaged by static electricity.

Similar to the ones in Embodiment Modes 1, 2, 4, and 5, the first protective circuit 1202 reduces the energy of static electricity generated through dry etching for opening the contact holes in the interlayer insulating film to thereby prevent electrostatic discharge damage to a pixel TFT and a driving circuit TFT.

[Embodiment 1]

A method of manufacturing a semiconductor device that has a first protective circuit incorporated therein will be described in detail with reference to FIGS. 2A to 7.

Figure 7:
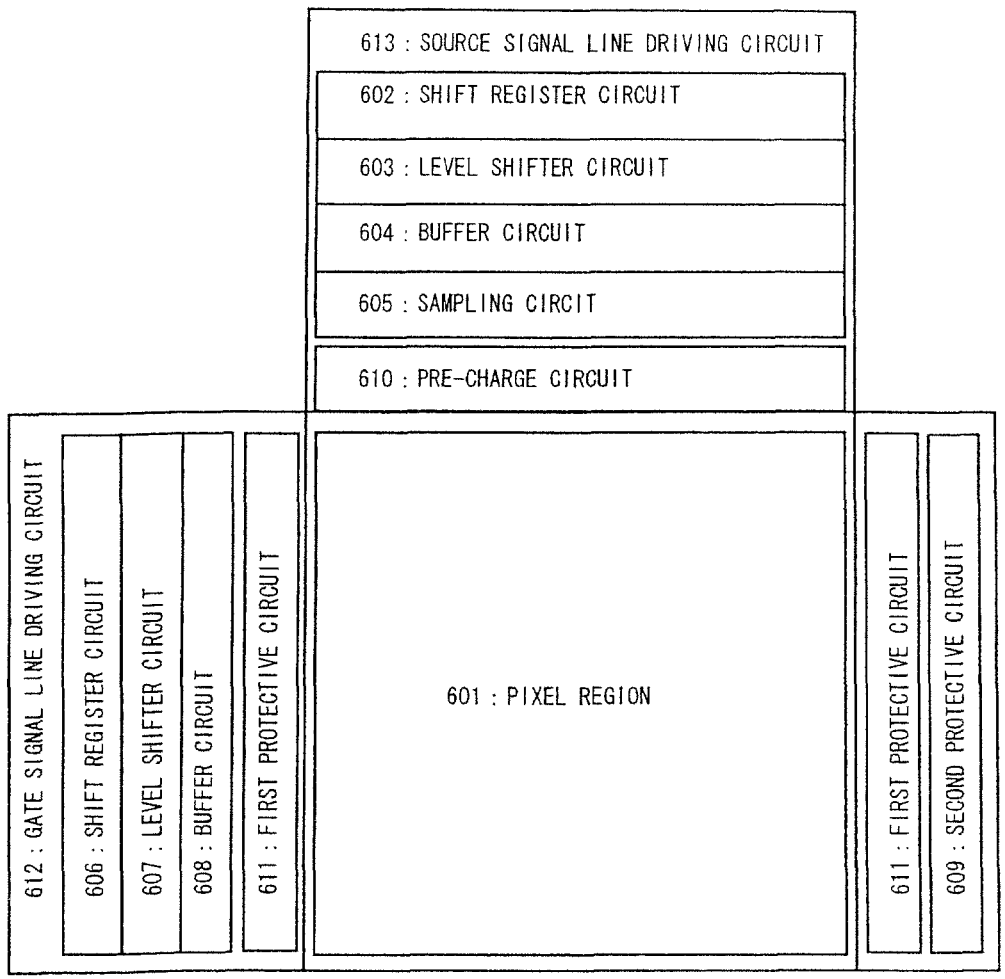
FIG. 7 is a diagram showing the entire circuit structure of a semiconductor device.

FIG. 7 shows the entire circuit structure of a semiconductor device to which the present invention is applied. The semiconductor device comprises a pixel region 601, a gate signal line side driving circuit 612, and a source signal line side driving circuit 613. The gate signal line side driving circuit 612 comprises a shift register circuit 606, a level shifter circuit 607, a buffer circuit 608, a second protective circuit 609, and first protective circuits 611. The source signal line side driving circuit 613 comprises a shift register circuit 602, a level shifter circuit 603, a buffer circuit 604, a sampling circuit 605, and a pre-charge circuit 610. Polycrystalline silicon TFTs having the GOLD structure that is an effective hot carrier countermeasure are used for the shift register circuits 602 and 606, the level shifter circuits 603 and 607, and the buffer circuits 604 and 608. On the other hand, polycrystalline silicon TFTs having the LDD structure that is effective in reducing the OFF current value are used for the pixel region 601 and the sampling circuit 605 that is a part of the peripheral circuits. One of the first protective circuits 611 is placed between the pixel region 601 and the buffer circuit 608 whereas the other is placed between the pixel region 601 and the second protective circuit 609. The pre-charge circuit 610 is interposed between the pixel region 601 and the sampling circuit 605.

A specific description will be given below with reference to FIGS. 2A to 6C on a method of manufacturing the semiconductor device having the circuit structure described above. FIGS. 2A to 6C are sectional views taken along the line A-A' of FIG. 8A, which is an illustration of Embodiment Mode 1.

First, a base film 101 is formed on a glass substrate 100 by plasma CVD. The base film 101 consists of a first layer silicon oxynitride film 101a with a thickness of 50 nm and a second layer silicon oxynitride film 101b with a thickness of 100 nm. The glass substrate 100 used here may be formed of quarts glass, barium borosilicate glass, alumino borosilicate glass, or the like. (FIG. 2A)

Next, an amorphous silicon film 102 with a thickness of 55 nm is formed on the base film 101 (101a and 101b) by plasma CVD. Then a nickel-containing solution is held to the top face of the amorphous silicon film. After the amorphous silicon film is subjected to dehydrogenation treatment (at 500° C. for an hour), thermal crystallization (at 550° C. for four hours) and laser annealing treatment are performed on the amorphous silicon film to change it into a polycrystalline silicon film 103. (FIG. 2B)

A silicon oxide film 105 with a thickness of 130 nm is formed on a polycrystalline silicon film 104, which is then doped with an impurity element (boron or phosphorus) in order to control the threshold of TFTs. (FIG. 2C)

Figure 1A:
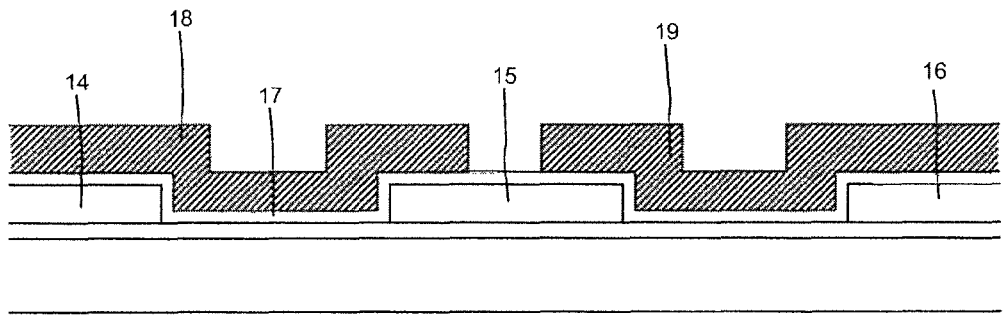
FIGS. 1A to 1C are diagrams showing a process of manufacturing a semiconductor device with a first protective circuit incorporated therein.
Figure 1B:
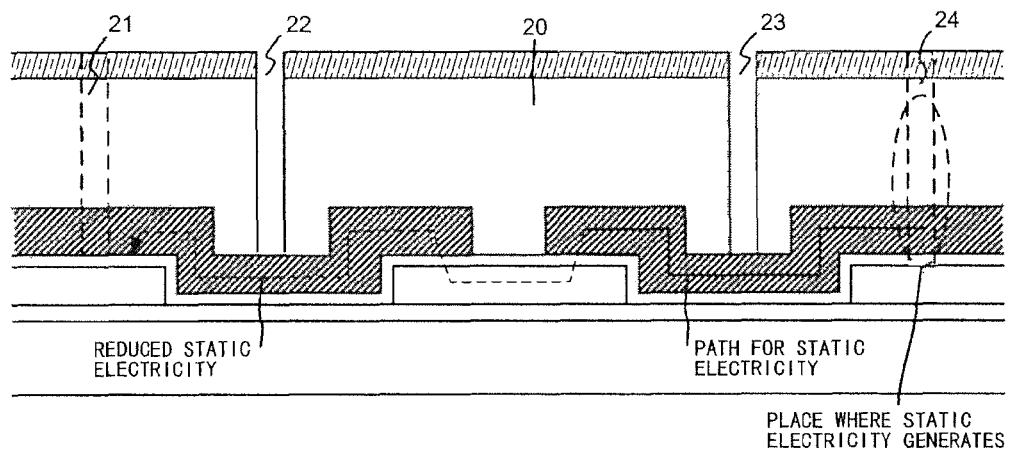
Figure 1C:
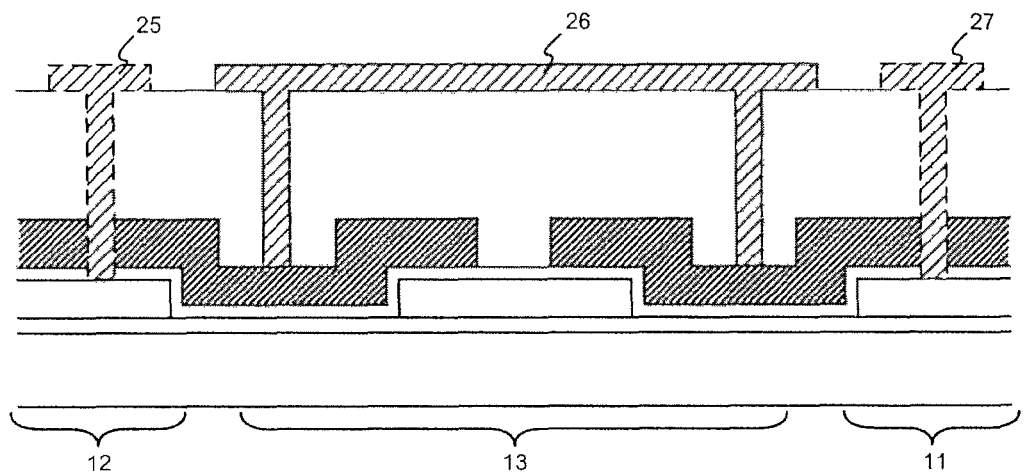
Figures 3A, 3B:
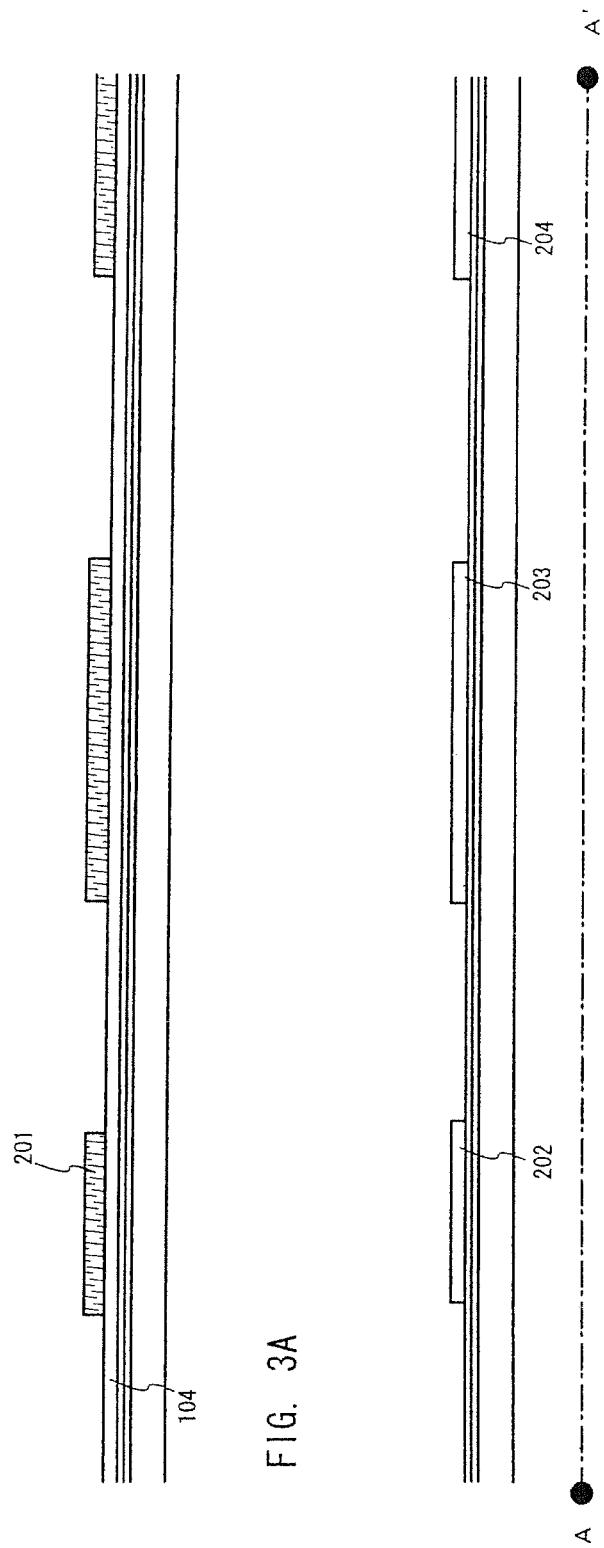
FIGS. 3A and 3B are diagrams showing a process of manufacturing a semiconductor device with a first protective circuit incorporated therein.

The polycrystalline silicon film is patterned next by photolithography and etching to form semiconductor layers 202 to 204. (FIGS. 3A and 3B)

A gate insulating film 301 that is a silicon oxynitride film formed by plasma CVD to a thickness of 115 nm is formed so as to cover the semiconductor layers 202 to 204. Formed on the gate insulating film 301 by sputtering is a gate electrode film consisting of a 30 nm thick TaN film 302 and a 370 nm thick tungsten film 303. (FIG. 4A)

Next, resist patterns 304 to 307 for forming gate electrodes are used as masks to perform dry etching on the gate electrode film which consists of a TaN film and a tungsten film and which measures 400 nm in thickness in total. Tapered gate electrodes are obtained by gradually pulling the resist patterns back during dry etching. (FIG. 4B)

Without removing the resist patterns 304 to 307 after the dry etching, high concentration ion implantation of an n type impurity is carried out as first ion implantation treatment. As a result, high concentration impurity regions (n+ regions) 312 to 314 are formed in regions of the semiconductor layers 203 and 204 that are not covered with gate electrodes 310 and 311. Conditions for the fist ion implantation treatment include using phosphorus as the n type impurity, setting the dose to $1.5 \times 10^{15}$ atoms/cm$^2$, and setting the acceleration voltage to 80 kV. (FIG. 4B)

The gate electrodes are again subjected to dry etching. This time, the initial resist patterns 304 to 307 are utilized but the etching conditions are changed so that the gate electrodes receive anisotropic etching. In this etching, the TaN film is etched and recedes and the tungsten film is tapered at a taper angle of nearly 90°. (FIG. 4C)

Then low concentration ion implantation of an n type impurity is carried out as second ion implantation treatment. The conditions for the second ion implantation treatment include using phosphorus, setting the dose to $1.5 \times 10^{14}$ atoms/cm$^2$, and setting the acceleration voltage to 90 kV. In the second ion implantation treatment, regions covered with the TaN film are doped with phosphorus through the TaN film and the gate insulating film and, as a result, n—regions 403 and 404 are formed at positions where the regions overlap the gate electrodes. In regions that are not covered with the TaN film, on the other hand, portions outside the gate electrodes are doped with phosphorus through the gate insulating film to form—regions 401 and 402. (FIG. 5A)

The next step is photolithography with which a resist aperture is opened in a capacitor storage 522 region in the pixel region by patterning while covering the rest with resist patterns 405 and 406. (FIG. 5B)

Using the resist patterns 405 and 406 as masks, high concentration ion implantation of a p type impurity is carried out as third ion implantation treatment. In the third ion implantation treatment, the capacitor storage 522 region receives ion implantation of a p type impurity, such as boron; that is an impurity element imparting the conductivity type reverse to the conductivity type of the impurity used in previous ion implantation. A high concentration impurity region (p+ region) is formed in a region 407 that is covered with the TaN film but not with the gate electrode 311. The third ion implantation region has already received ion implantation of phosphorus that is an n type impurity. However, the region is doped with boron that is a p type impurity element in a concentration of $2 \times 10^{20}$ to $2 \times 10^{21}$ atoms/cm$^3$, and therefore can function as source and drain regions of a p-channel polycrystalline silicon TFT. (FIG. 5C)

The resist patterns 405 and 406 are removed and then a silicon oxynitride film with a thickness of 150 nm is formed by plasma CVD as a first interlayer insulating film 501. The semiconductor layers 202 to 204 are subjected to thermal annealing at 550° C. for four hours to thermally activate the impurity elements implanted in the semiconductor layers. In this embodiment, gettering of nickel used as a catalyst for crystallization of the semiconductor layers 202 to 204 is done at the same time the impurity elements are thermally activated. This gettering is for lowering the OFF current value of the TFTs and for improving the field effect mobility of the TFTs. Through gettering, nickel is moved to the impurity regions 312 to 314 containing a high concentration of phosphorus and the nickel concentration is lowered in the semiconductor layers that are to serve as channel formation regions. With a channel formation region formed in this way, a TFT can exhibit excellent electric characteristics such as reduced OFF current value. The thermal activation treatment may be conducted before the first interlayer insulating film 501 is formed. However, if a wiring line material of the gate electrodes 310 and 311 is weak against heat, it is preferred to form the interlayer insulating film before the thermal activation treatment as in this embodiment. Then heat treatment is carried out in a nitrogen atmosphere containing 3% of hydrogen at 410° C. for an hour, so that the semiconductor layers 202 to 204 are hydrogenated and dangling bonds thereof are terminated. (FIG. 6A)

On the first interlayer insulating film 501 formed of silicon oxynitride, second interlayer insulating film 506 is formed to a thickness of 1.6 μm from an organic insulating material comprised of an acrylic resin. Thereafter, contact holes are formed through photolithography and dry etching to connect two gate signal lines 502 and 503 of a first protective circuit 520 to the impurity regions 312, 313, and 407, that are the first and third ion implantation regions. It has been confirmed that static electricity is generated at this stage. However, the first protective circuit has already been completed and the generated static electricity damages the first protective circuit 520. Therefore electrostatic discharge damage to a pixel TFT and a driving circuit TFT can be prevented. (FIG. 6B)

Formed next is a metal wiring line 507 for electrically connecting the two gate signal lines 502 and 503 of the first protective circuit 520. Connection electrodes 508 and 509 in a pixel region 523 and a connection electrode 510 in the capacitor storage 522 are formed at the same time the metal wiring line 507 is formed. The metal wiring line used here is a laminate consisting of a Ti film 50 nm in thickness and a Al—Ti alloy film 500 nm in thickness. The connection electrode 509 is connected to the impurity region 313 of a pixel TFT 521 whereas the connection electrode 510 is connected to the impurity region 407 of the capacitor storage 522. Next, a transparent electrode film such as an ITO (indium tin oxide) film is formed to a thickness of 110 nm to form a transparent pixel electrode 511 through photolithography and dry etching. The transparent pixel electrode 511 is electrically connected to the impurity region 313 of the pixel TFT 521 through the connection electrode 509. The transparent pixel electrode 511 is electrically connected to the impurity region 407 of the capacitor storage 522 through the connection electrode 510. (FIG. 6C)

Thus completed is the semiconductor device comprising the first protective circuit 520 and the pixel portion 523 that has the pixel TFT 521 and the storage capacitor 522.

[Embodiment 2]

FIGS. 16A to 17C show an example of applying the techniques of the present invention to a semiconductor device. FIG. 16B is an enlarged view of FIG. 16A.

Static electricity generated in a contact hole ① at the upper end of a pixel region moves to a contact hole ② that is provided in advance at the lower end of a first signal line ③ of a pre-charge circuit. Running along the first signal line ③ of the pre-charge circuit, the static electricity moves from a contact hole ④ to a contact hole ⑤ of a second signal line of the pre-charge circuit and then to the second signal line of the pre-charge circuit.

In a conventional circuit where the contact hole ② is not provided in the lower end of the first signal line ③ of the pre-charge circuit, the static electricity generated in the pixel region moves from the contact hole ① at the upper end of the pixel region to a contact hole ②' in a drain portion of the pre-charge circuit, and then travels along the first signal line ③ of the pre-charge circuit to reach the contact hole ⑤ of the second signal line of the pre-charge circuit and to enter the second signal line of the pre-charge circuit from there. The pre-charge circuit is damaged by the static electricity when it moves from the contact hole ②' of the drain portion of the pre-charge circuit to the first signal line ③ of the pre-charge circuit.

Figure 17A:
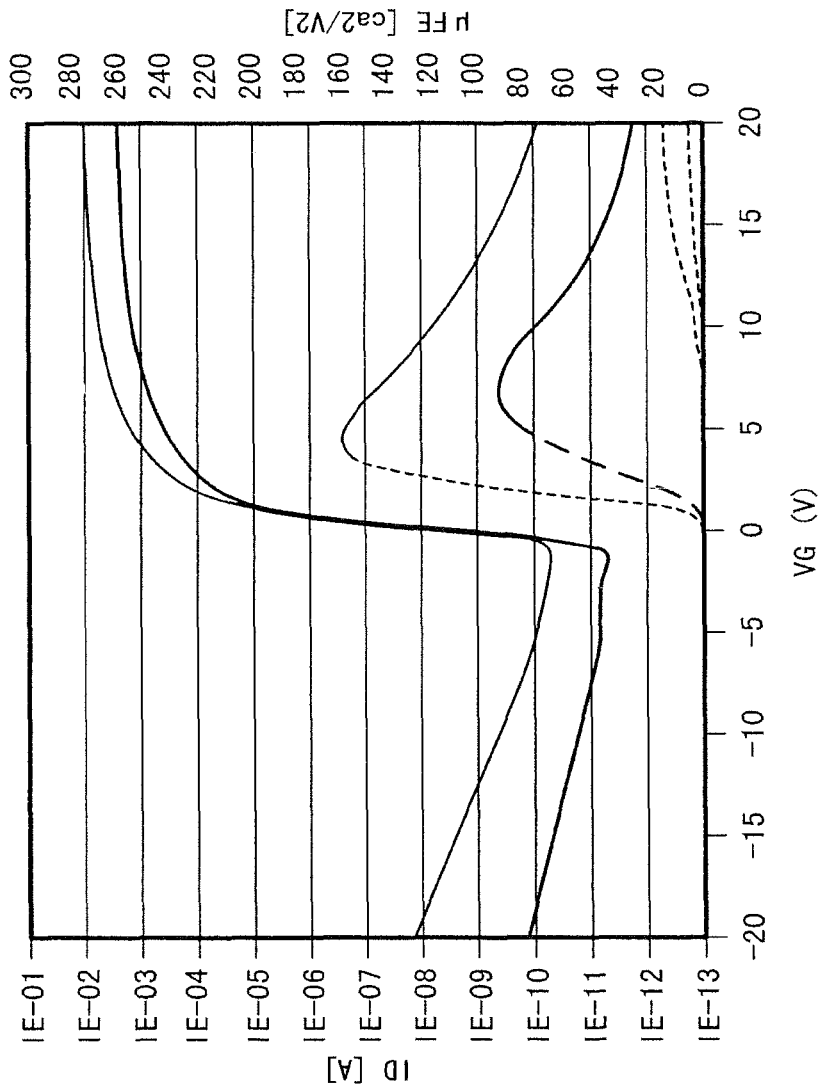
FIGS. 17A to 17C are graphs showing electric characteristics.
Figure 17B:
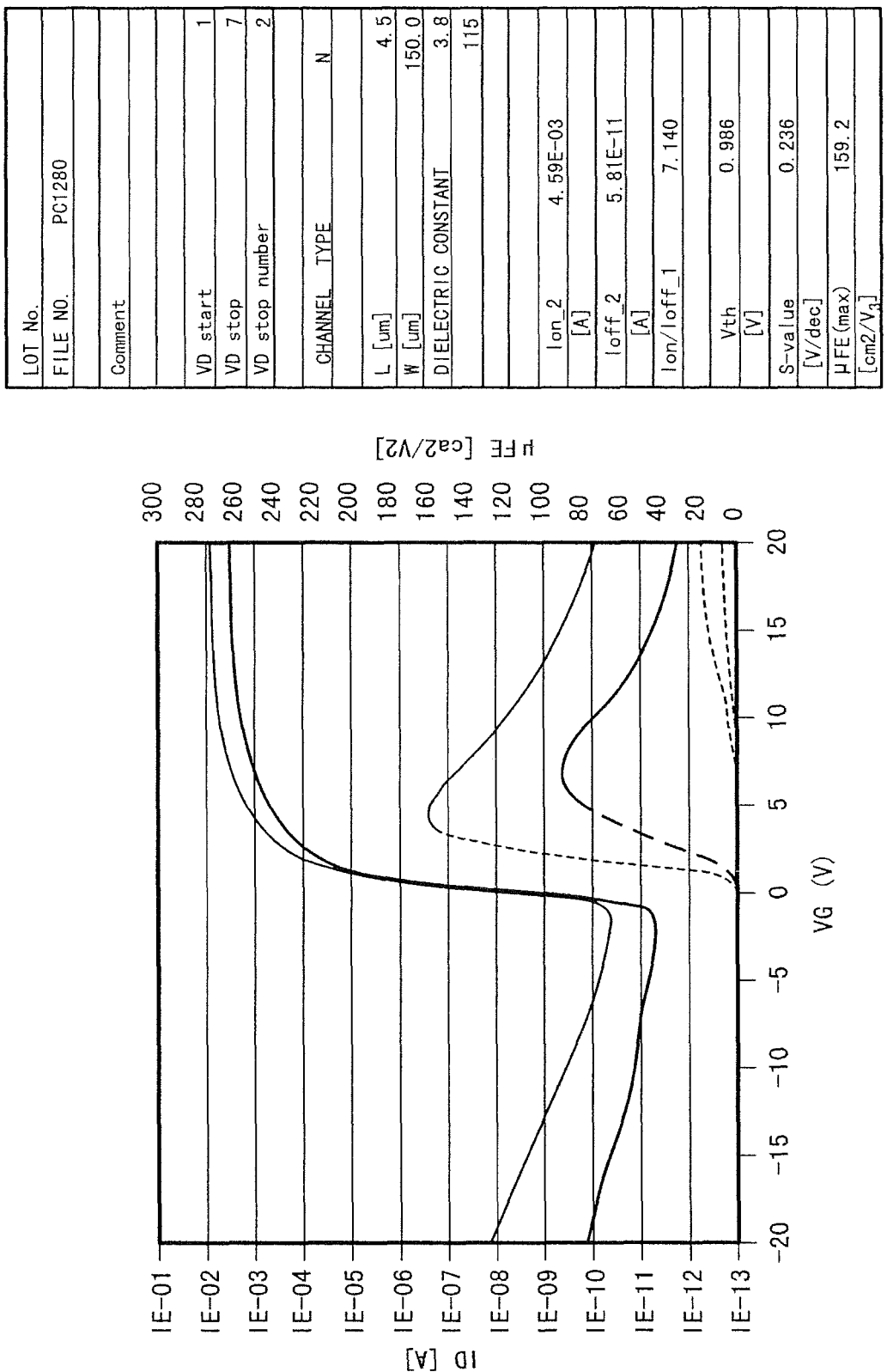
Figure 17C:
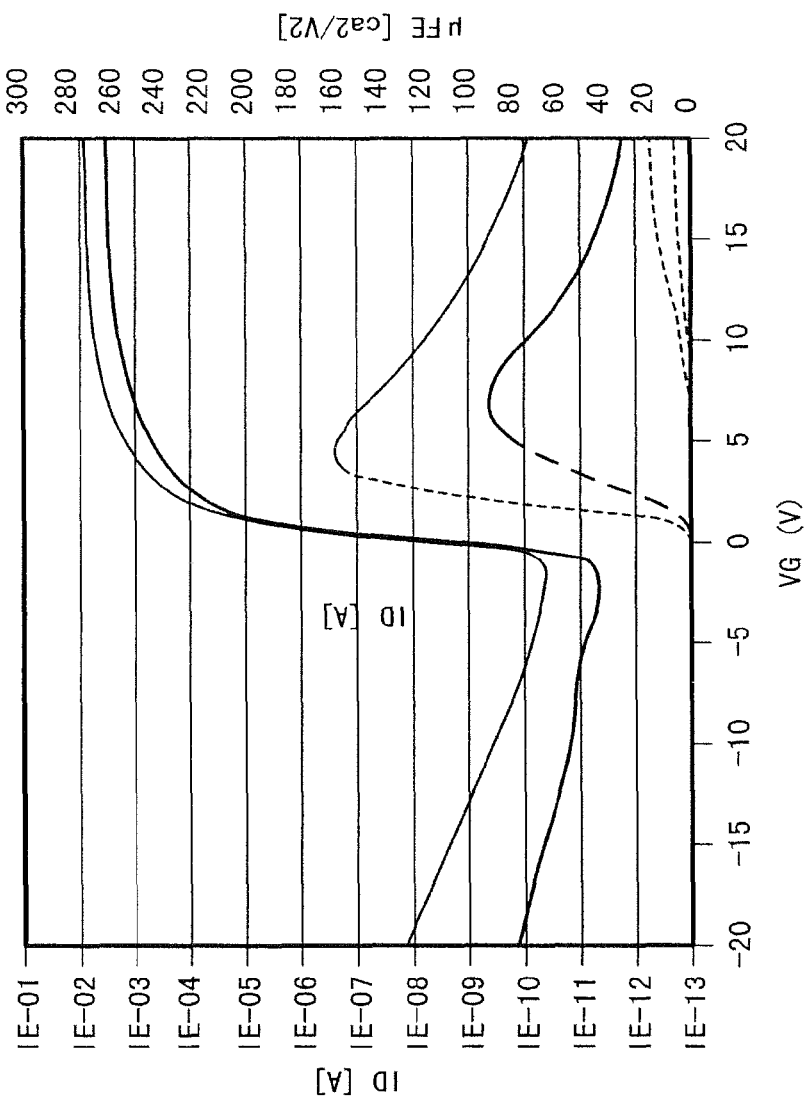
Figure 18:
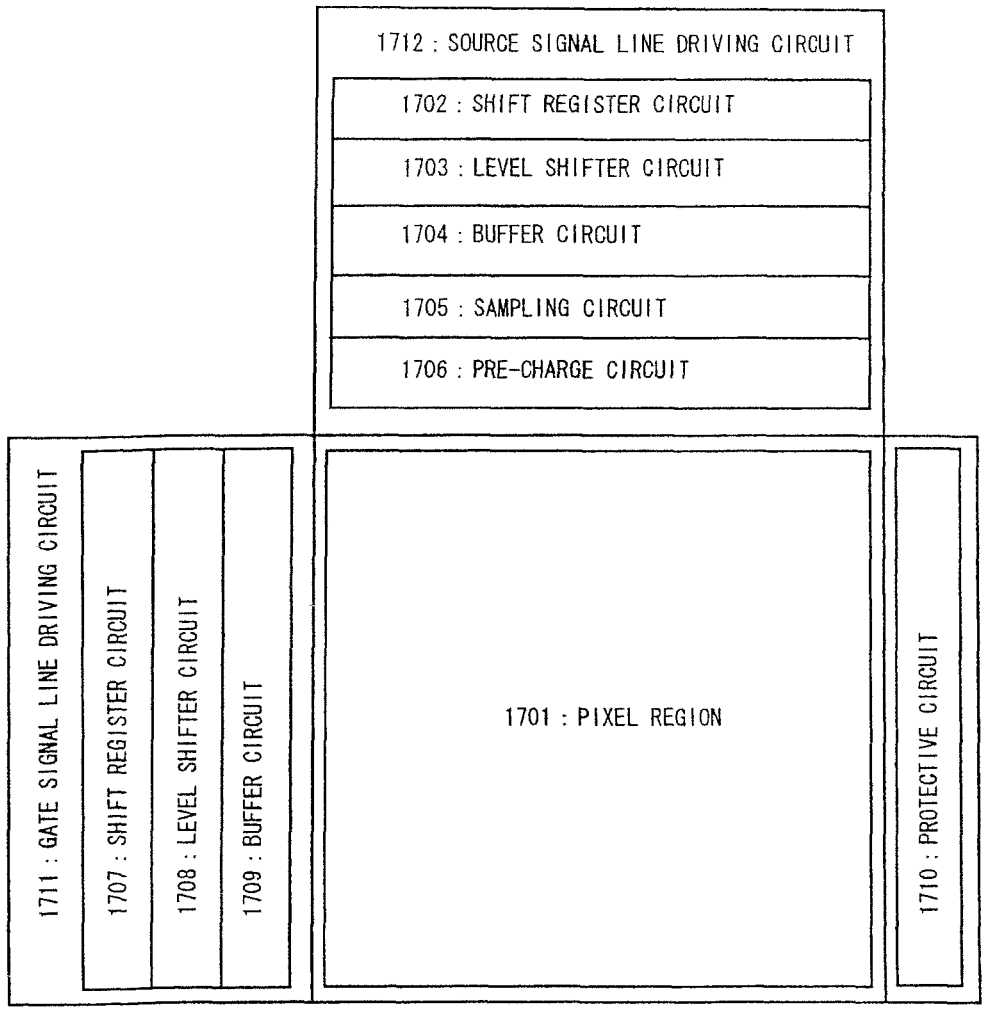
FIG. 18 is a diagram showing an example of the entire circuit structure of a conventional semiconductor device.
Figure 19A:
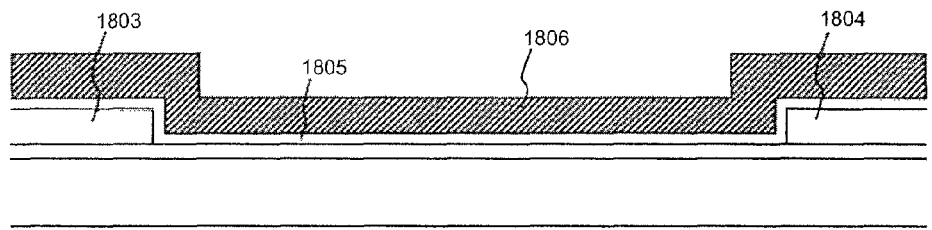
FIGS. 19A to 19C are diagrams showing a method of manufacturing a conventional circuit, electrostatic generation, and damage to TFTs by static electricity.
Figure 19B:
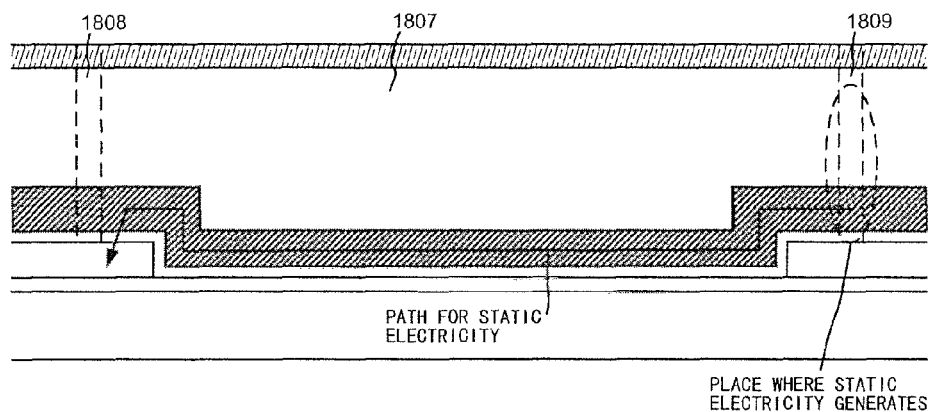
Figure 19C:
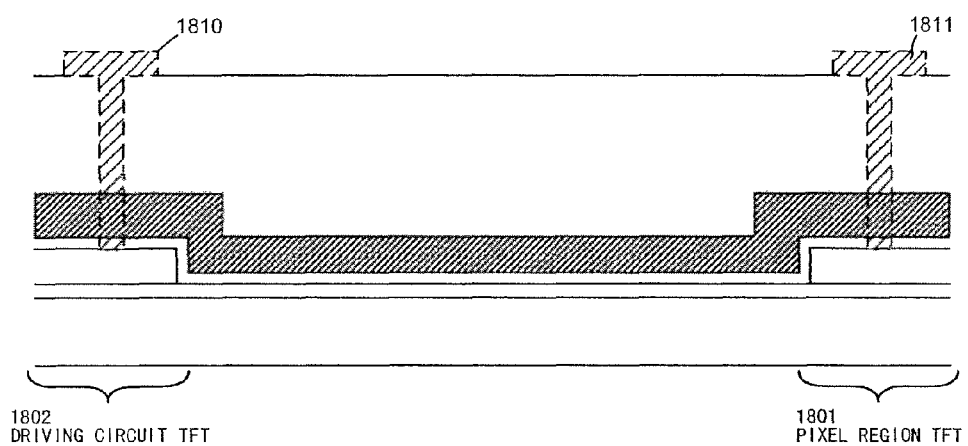
Figure 20:
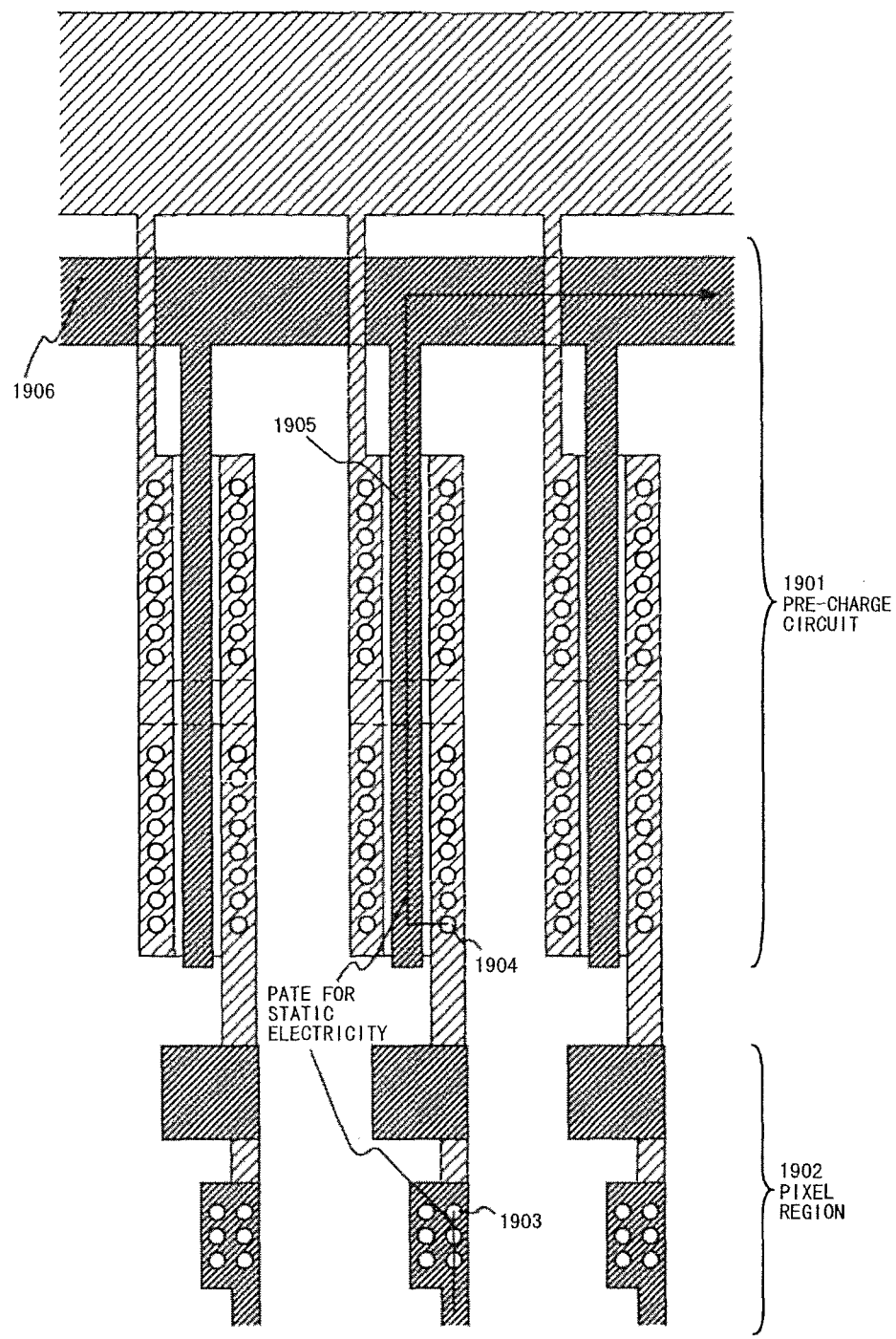
FIG. 20 is a diagram showing damage to TFTs by static electricity near a pre-charge circuit in a conventional circuit.

FIGS. 17A to 17C are graphs proving, through electric characteristic measurement, that the techniques of the present invention are successful in preventing electrostatic discharge damage to the pre-charge circuit even though the static electricity generated in the pixel region running about the pre-charge circuit.

There is a trace of static electricity running in the 1280-th stage address (FIG. 17B) but electric characteristics thereof are no different from those of the 1279-th stage address (FIG. 17A) and the 1281-th stage address (FIG. 17C) where no trace of static electricity movement is found. This shows that the countermeasure against the electrostatic discharge damage is working well.

The above results proves that the present invention is capable of preventing electrostatic discharge damage to a pre-charge circuit and improving the yield and reliability of a semiconductor device.

[Embodiment 3]

The active matrix substrate and the liquid crystal display device fabricated by implementing the present invention can be utilized for various electro-optical devices. Namely, the present invention can be implemented onto all of the electronic devices that incorporate such electro-optical devices as a display portion.

Following can be given as such electronic devices: video cameras; digital cameras; projectors (rear type or front type); head mounted displays (goggle type displays); car navigation systems; car stereo; personal computers; portable information terminals (mobile computers, portable telephones or electronic books etc.) etc. Examples of these are shown in FIGS. 14 and 15.

Figure 14A:
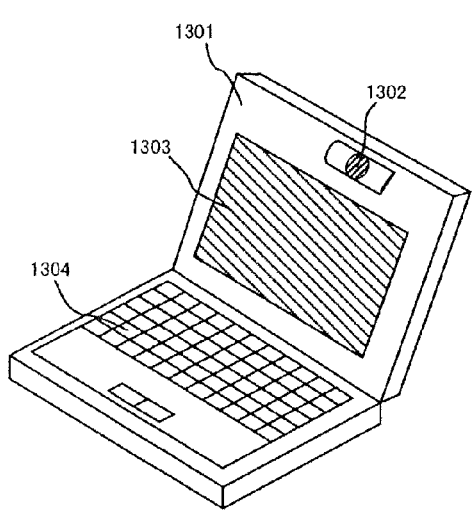
FIGS. 14A to 14F are diagram's showing examples of devices utilizing a semiconductor device.

FIG. 14A is a personal computer which comprises: a main body 1301; an image input section 1302; a display section 1303; and a key board 1304. The present invention can be applied to the image input section 1302, the display section 1303 and other driver circuits.

Figure 14B:
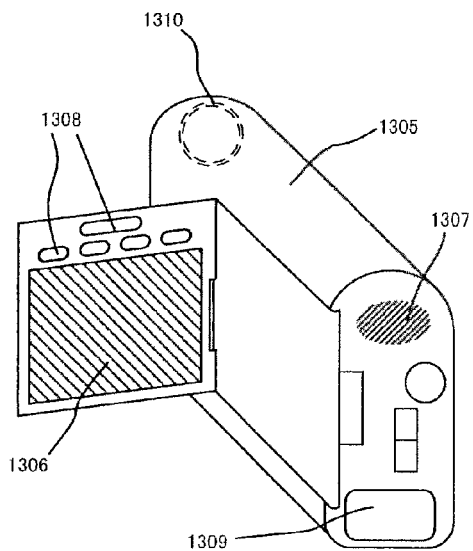

FIG. 14B is a video camera which comprises: a main body 1305; a display section 1306; a voice input section 1307; operation switches 1308; a battery 1309 and an image receiving section 1310. The present invention can be applied to the display section 1306, a voice input section 1307 and other driver circuits.

Figure 14C:
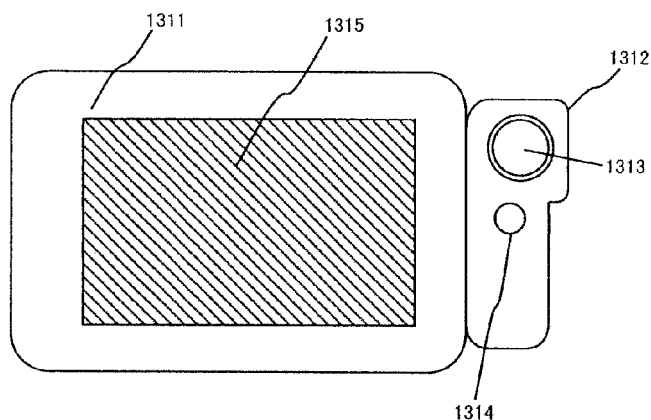

FIG. 14C is a mobile computer which comprises: a main body 1311; a camera section 1312; an image receiving section 1313; operation switches 1314 and a display section 1315. The present invention can be applied to the display section 1315 and other driver circuits.

Figure 14D:
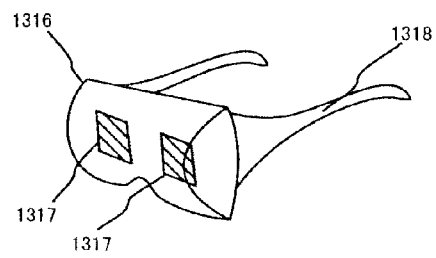

FIG. 14D is a goggle type display which comprises: a main body 1316; a display section 1317; and an arm section 1318. The present invention can be applied to the display section 1317 and other driver circuits.

Figure 14E:
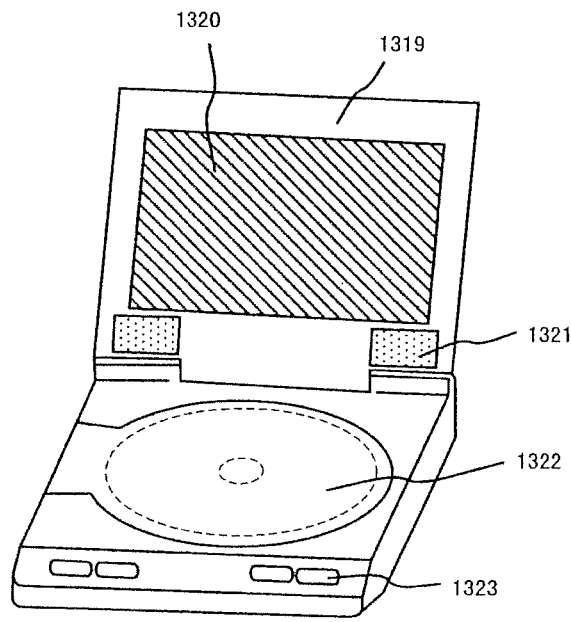

FIG. 14E is a player using a recording medium which records a program (hereinafter referred to as a recording medium) which comprises: a main body 1319; a display section 1320; a speaker section 1321; a recording medium 1332; and operation switches 1323. This device uses DVD (digital versatile disc), CD. etc. for the recording medium, and can perform music appreciation, film appreciation, games and the use for Internet. The present invention can be applied to the display section 1320 and other driver circuits.

Figure 14F:
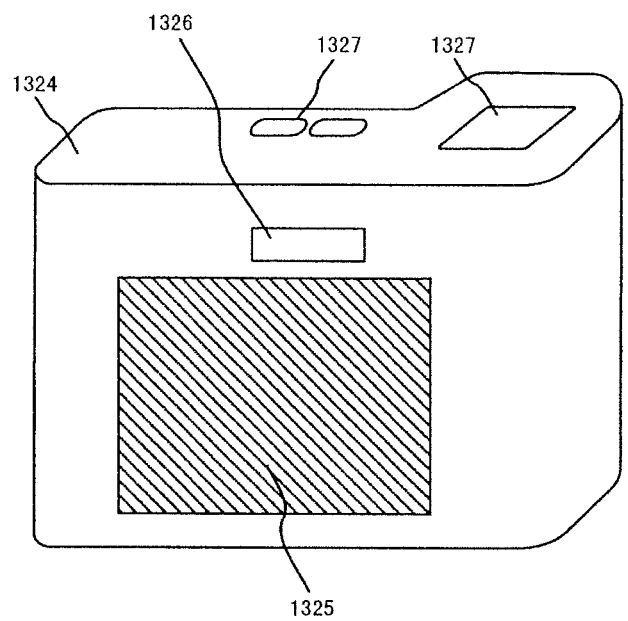
Figure 16A:
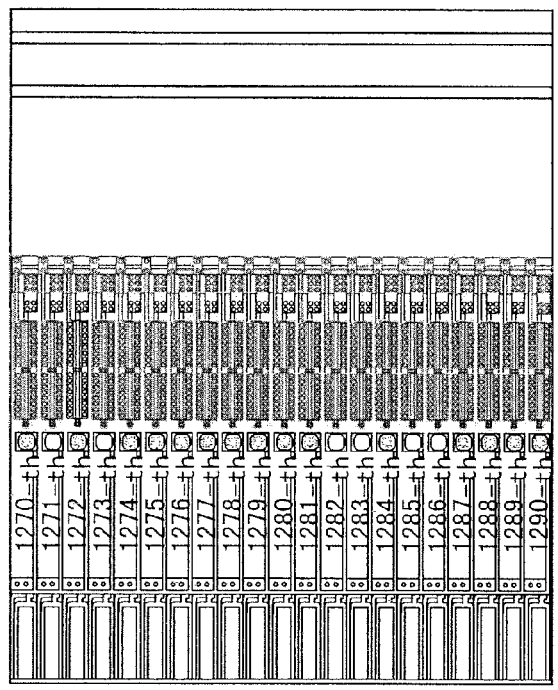
FIGS. 16A and 16B are diagrams showing a successful example of preventing electrostatic discharge damage to a pre-charge circuit by providing a path in the pre-charge circuit so that static electricity travels along the path.
Figure 16B:
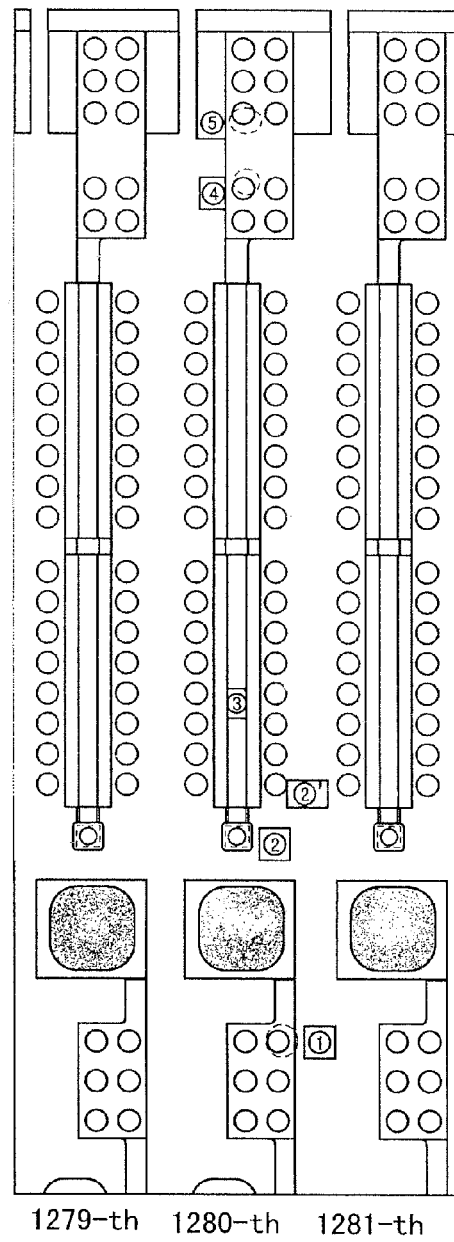

FIG. 14F is a digital camera which comprises: a main body 1324; a display portion 1325; a view finder 1326; operation switches 1327; and an image receiving section (not shown in the figure). The present invention can be applied to the display section 1325 and driver circuits.

FIG. 15A is a front type projector which comprises: a light source optical system and a display device 1401; and a screen 1402. The present invention can be applied to the display section and other driver circuits.

FIG. 15B is a rear type projector which comprises: a main body 1403; a light source optical system and a display device 1404; a mirror 1405: and a screen 1406. The present invention can be applied to the display section and other driver circuits.

As described above, the applicable range of the present invention is very large, and the invention can be applied to electronic devices of various areas. Note that the electronic devices of the present embodiment can be achieved by utilizing any combination of constitutions in Embodiment mode 1 to 4, Embodiments 1, 2 and 3.

According to the present invention, a first protective circuit, or a contact hole at an end of a first signal line of a pre-charge circuit, is used to reduce the energy of static electricity generated during etching for opening contact holes in an interlayer insulating film, thereby preventing electrostatic discharge damage to a pixel TFT, a driving circuit TFT, and the pre-charge circuit.

By preventing electrostatic discharge damage, the present invention can improve the yield and reliability of a semiconductor device and is effective in reducing manufacture cost.

What is claimed is:

1. A display device comprising:
   a pixel region comprising a plurality of pixels; and
   a protective circuit electrically connected to the pixel region, wherein the protective circuit comprises:
   a film;
   a first insulating film over the film, wherein a top surface and a side surface of the film are in contact with the first insulating film;
   a first conductive film and a second conductive film over the first insulating film;
   a wiring over the film and in contact with the first conductive film and the second conductive film; and
   a second insulating film between the wiring and each of the first conductive film and the second conductive film,
   wherein the film overlaps with the first conductive film, the second conductive film, and the wiring,
   wherein the first conductive film and the second conductive film are spaced apart from each other in a region overlapping with the film,
   wherein an end portion of the film overlaps with the first conductive film and the second conductive film, and
   wherein the film is in a floating state.

2. The display device according to claim 1, wherein the film is a crystalline semiconductor film.

3. The display device according to claim 1, wherein the wiring is a metal wiring.

4. The display device according to claim 1, wherein the first conductive film and the second conductive film are gate signal lines.

5. The display device according to claim 1, wherein the wiring is located over the first conductive film and the second conductive film.

6. The display device according to claim 1, wherein a contact portion between the wiring and the first or second conductive film does not overlap with the film.

7. The display device according to claim 1, wherein the protective circuit is electrically connected to a driving circuit region.

8. The display device according to claim 1, wherein the display device is a liquid crystal display device.

9. A display device comprising:
- a pixel region comprising a plurality of pixels; and
- a protective circuit electrically connected to the pixel region, wherein the protective circuit comprises:
  - a film having an island shape;
  - a first insulating film over the film, wherein a top surface and a side surface of the film are in contact with the first insulating film;
  - a first conductive film and a second conductive film over the first insulating film;
  - a wiring over the film and in contact with the first conductive film and the second conductive film; and
  - a second insulating film between the wiring and each of the first conductive film and the second conductive film,
- wherein the film overlaps with the first conductive film, the second conductive film, and the wiring,
- wherein the first conductive film and the second conductive film are spaced apart from each other in a region overlapping with the film,
- wherein an end portion of the film overlaps with the first conductive film and the second conductive film, and
- wherein the film is in a floating state.

10. The display device according to claim 9, wherein the film is a crystalline semiconductor film.

11. The display device according to claim 9, wherein the wiring is a metal wiring.

12. The display device according to claim 9, wherein the first conductive film and the second conductive film are gate signal lines.

13. The display device according to claim 9, wherein the wiring is located over the first conductive film and the second conductive film.

14. The display device according to claim 9, wherein a contact portion between the wiring and the first or second conductive film does not overlap with the film.

15. The display device according to claim 9, wherein the protective circuit is electrically connected to a driving circuit region.

16. The display device according to claim 9, wherein the display device is a liquid crystal display device.

17. A display device comprising:
- a pixel region comprising a plurality of pixels; and
- a protective circuit electrically connected to the pixel region, wherein the protective circuit comprises:
  - a first film;
  - a first insulating film over the first film, wherein a top surface and a side surface of the first film are in contact with the first insulating film;
  - a first conductive film and a second conductive film over the first insulating film;
  - a second film to electrically connect the first conductive film and the second conductive film to each other, the second film over the first film and in contact with the first conductive film and the second conductive film; and
  - a second insulating film between the second film and each of the first conductive film and the second conductive film,
- wherein the first film overlaps with the first conductive film, the second conductive film, and the second film,
- wherein the first conductive film and the second conductive film are spaced apart from each other in a region overlapping with the first film,
- wherein an end portion of the first film overlaps with the first conductive film and the second conductive film, and
- wherein the first film is in a floating state.

18. The display device according to claim 17, wherein the first film is a crystalline semiconductor film.

19. The display device according to claim 17, wherein the first conductive film and the second conductive film are gate signal lines.

20. The display device according to claim 17, wherein the second film is located over the first conductive film and the second conductive film.

21. The display device according to claim 17, wherein a contact portion between the second film and the first or second conductive film does not overlap with the first film.

22. The display device according to claim 17, wherein the protective circuit is electrically connected to a driving circuit region.

23. The display device according to claim 17, wherein the display device is a liquid crystal display device.

24. The display device according to claim 17, wherein the second film is a metal wiring.

25. The display device according to claim 17, wherein the second film is a conductive film.

26. The display device according to claim 17, wherein the first film is a semiconductor film.

27. The display device according to claim 17, wherein the second insulating film is over the first conductive film and the second conductive film.

28. The display device according to claim 17, wherein the second film is over the second insulating film.

* * * * *